(12) United States Patent
Correia Fortunato et al.

(10) Patent No.: US 9,196,689 B2
(45) Date of Patent: Nov. 24, 2015

(54) P-TYPE OXIDE ALLOYS BASED ON COPPER OXIDES, TIN OXIDES, TIN—COPPER ALLOY OXIDES AND METAL ALLOY THEREOF, AND NICKEL OXIDE, WITH EMBEDDED METALS THEREOF, FABRICATION PROCESS AND USE THEREOF

(75) Inventors: Elvira Maria Correia Fortunato, Charneca da Caparica (PT); Rodrigo Ferrão De Paiva Martins, Charneca da Caparica (PT); Ana Raquel Xarouco De Barros, Alfragide (PT); Nuno Filipe De Oliveira Correia, Quinta do Conde (PT); Vitor Manuel Loureiro Figueiredo, Silgueiros-Viseu (PT); Pedro Miguel Cândido Barquinha, Montijo (PT); Sang-Hee Ko Park, Daejon (KR); Chi-Sun Hwang, Daejon (KR)

(73) Assignees: FACULDADE DE CIENCIAS E TECHNOLOGIA DA UNIVERSIDADE NOVA DE LISBOA, Caparica (PT); ELECTRONIC AND TELECOMMUNICATIONS RESEARCH INSTITUTE, Daejon (KR)

( * ) Notice: Subject to any disclaimer, the term of this patent is extended or adjusted under 35 U.S.C. 154(b) by 314 days.

(21) Appl. No.: 13/640,214

(22) PCT Filed: Apr. 6, 2011

(86) PCT No.: PCT/IB2011/051487
§ 371 (c)(1),
(2), (4) Date: Dec. 13, 2012

(87) PCT Pub. No.: WO2011/125036
PCT Pub. Date: Oct. 13, 2011

(65) Prior Publication Data
US 2013/0075740 A1    Mar. 28, 2013

(30) Foreign Application Priority Data
Apr. 6, 2010 (PT) .......................................... 105039

(51) Int. Cl.
*H01L 29/24*    (2006.01)
*H01L 21/02*    (2006.01)

(52) U.S. Cl.
CPC ........ *H01L 29/247* (2013.01); *H01L 21/02521* (2013.01); *H01L 21/02565* (2013.01); *H01L 21/02579* (2013.01); *H01L 21/02628* (2013.01); *H01L 21/02631* (2013.01)

(58) Field of Classification Search
None
See application file for complete search history.

(56) References Cited

U.S. PATENT DOCUMENTS

| | | | | |
|---|---|---|---|---|
| 5,010,024 A | * | 4/1991 | Allen et al. | 438/659 |
| 5,439,849 A | * | 8/1995 | McBride et al. | 438/763 |
| 5,801,425 A | * | 9/1998 | Kuroi et al. | 257/383 |
| 2005/0017261 A1 | | 1/2005 | Ishizaki | |
| 2007/0111380 A1 | * | 5/2007 | Cho et al. | 438/106 |

FOREIGN PATENT DOCUMENTS

CN     1017640675 A   *  6/2010

OTHER PUBLICATIONS

Ou et al., "Anomalous p-channel amorphous oxide transistors based in tin oxide and their complementary circuits," Applied Physics Letters 92, 2008, 122113-122113-3.*
Togo et al., "First-principles calculations of native defects in tin monoxide," Physical Review B 74, 2006, 195128-1 to 195128-8.*
Suda et al. (1992). The effect of atmosphere and doping on electrical conductivity of CuO. *Japanese Journal of Applied Physics*, 31(8), 2488-2491.
Pan & Fu (2001). Oxidation and phase transitions of epitaxial tin oxide thin films on (1012) sapphire. *Journal of Applied Physics*, 89(11), 6048-6055.
Korotkov et al. (2008). Atmospheric plasma discharge chemical vapor deposition of $SnO_x$ thin films using various tin precursors. *Thin Solid Films*, 516(15), 4720-4727.
Guo et al. (2010). Microstructure, optical, and electrical properties of p-type SnO thin films. *Applied Physics Letters*, 96(4), 42113-1-42113-3.

Ang et al. (2009). Charging effect and capacitance modulation of Ni-rich NiO thin film. *Applied Physics Letters*, 95(1), 12104-1-12104-3.

Reguig et al. (2006). Effect of the precursor solution concentration on the NiO thin film properties deposited by spray pyrolysis. *Solar Energy Materials & Solar Cells*, 90(10), 1381-1392.

Ai et al. (2008). Influence of substrate temperature on electrical and optical properties of p-type semitransparent conductive nickel oxide thin films deposited by radio frequency sputtering. *Applied Surface Science*, 254(8), 2401-2405.

Hutchins & Murphy (1998). The electrochromic behavior of tin—nickel oxide. *Solar Energy Materials and Solar Cells*, 54, 75-84.

International Search Report, mailed Aug. 5, 2011 in connection with PCT International Application No. PCT/IB2011/051487, filed Apr. 6, 2011.

Written Opinion of the International Searching Authority, mailed Aug. 5, 2011, in connection with PCT International Application No. PCT/IB2011/051487, filed Apr. 6, 2011.

\* cited by examiner

*Primary Examiner* — Bilkis Jahan
*Assistant Examiner* — Kevin Quinto
(74) *Attorney, Agent, or Firm* — John P. White; Cooper & Dunham LLP

(57) ABSTRACT

The present invention relates to thin films comprising non-stoichiometric monoxides of: copper $(OCu_2)_x$ with embedded cubic metal copper $(Cu_{cy})$ $[(OCu_2)_x+(Cu_{1-2})_y$, wherein $0.05 \leq x < 1$ and $0.01 \leq y \leq 0.9$]; of tin $(OSn)_{\alpha x}$ with embedded metal tin $(Sn_{\beta x})$ $[(OSn)_z+(Sn_{1-2})_w$, wherein $0.05 \leq z < 1$ and $0.01 \leq w \leq 0.9$]; $Cu_{cx}$—$Sn_{\beta x}$ alloys with embedded metal Sn and Cu $[(O-Cu-Sn)_a+(Cu_\alpha-Sn_\beta)_b$ with $0 < \alpha < 2$ and $0 < \beta < 2$, wherein $0.05 \leq a < 1$ and $0.01 \leq b \leq 0.9$]; and of nickel $(ONi)_x$ with embedded Ni and Sn species $[(O-Ni)_a+(Ni_\alpha-Sn_\beta)_b$ with $0 < \alpha < 2$ and $0 < \beta < 2$, wherein $0.05 \leq a < 1$ and $0.01 \leq b \leq 0.9$]; or combinations thereof, with amorphous, or nanocrystalline, or polycrystalline structure, either doped or not, with impurities such as zirconium, nitrogen or fluorine, for the fabrication of CMOS or TFT devices, with active matrices for LCD or OLED, fabrication of logic circuits, among others, using rigid or flexible substrates, wherein a protection layer, such as SU8 or the like, or silicon oxide or silicon nitride films are used for encapsulation.

17 Claims, 19 Drawing Sheets

P-TYPE OXIDE ALLOYS BASED ON COPPER OXIDES, TIN OXIDES, TIN—COPPER ALLOY OXIDES AND METAL ALLOY THEREOF, AND NICKEL OXIDE, WITH EMBEDDED METALS THEREOF, FABRICATION PROCESS AND USE THEREOF

This application is a §371 national stage of PCT International Application No. PCT/IB2011/051487, filed Apr. 6, 2011, claiming priority of Portuguese Patent Application No. 105039, filed Apr. 6, 2010, the contents of each of which are hereby incorporated by reference in their entirety.

TECHNICAL FIELD OF THE INVENTION

The present invention relates to the creation and use of thin films comprising non-stoichiometric monoxides of: copper $(OCu_2)_x$ with embedded cubic metal copper $(Cu_{cy})$ $[(OCu_2)_x+(Cu_{1-2})_y]$, wherein $0.05 \leq x < 1$ and $0.01 \leq y \leq 0.9]$; of tin $(OSn)_{\alpha x}$ with embedded metal tin $(Sn_{\beta x})$ $[(OSn)_z+(Sn_{1-2})_w]$ wherein $0.05 \leq z < 1$ and $0.01 \leq w \leq 0.9]$; $Cu_{cx}$—$Sn_{\beta x}$ alloys with embedded metal Sn and Cu $[(O—Cu—Sn)_a+(Cu_\alpha—Sn_\beta)_b$ with $0<\alpha<2$ and $0<\beta<2$, wherein $0.05 \leq a < 1$ and $0.01 \leq b \leq 0.9]$; and of nickel $(ONi)_x$ with embedded Ni and Sn species $[(O—Ni)_a+(Ni_\alpha—Sn_\beta)_b$ with $0<\alpha<2$ and $0<\beta<2$, wherein $0.05 \leq a < 1$ and $0.01 \leq b \leq 0.9]$; or combinations thereof, with amorphous, or nanocrystalline, or polycrystalline structure, either doped or not, with impurities such as zirconium, nitrogen or fluorine, for the fabrication of CMOS or TFT devices, with active matrices for LCD or OLED, fabrication of logic circuits, among others, using rigid or flexible substrates, wherein a protection layer, such as SU8 or the like, or silicon oxide or silicon nitride films are used for encapsulation.

SUMMARY

The present invention describes a p-type material, characterized by comprising alloys based on:
  copper oxides, tin oxides, tin-copper oxides, nickel oxides, or nickel-tin oxides, in single form or as an alloy, and
  the metal species thereof embedded in the structure of said oxides;
or combinations thereof.
A preferred embodiment of the present invention has the feature of comprising in said alloys:
  copper monoxide with Cu metal species embedded in its structure $[(OCu_2)_x+(Cu_{1-2})_y]$, wherein $0.05 \leq x < 1$ and $0.01 \leq y \leq 0.9]$; or
  tin monoxide with Sn metal species embedded in its structure $[(OSn)_z+(Sn_{1-2})_w]$ wherein $0.05 \leq z < 1$ and $0.01 \leq w \leq 0.9]$; or
  copper and tin alloy monoxide containing Cu and Sn metal species in its structure, in single form or as an alloy $[(O—Cu—Sn)_a+(Cu_\alpha—Sn_\beta)_b$ with $0<\alpha<2$ and $0<\beta<2$, wherein $0.05 \leq a < 1$ and $0.01 \leq b \leq 0.9]$; or
  nickel or as an alternative nickel-tin monoxide, containing Ni and Sn metal species in its structure in single form or as an alloy $[(O—Ni)_a+(Ni_\alpha—Sn_\beta)_b$ with $0<\alpha<2$ and $0<\beta<2$, wherein $0.05 \leq a < 1$ and $0.01 \leq b \leq 0.9]$;
or combinations thereof.

Typically, in a preferred embodiment the percentage of metal species varies between 0.5% and 15%, notwithstanding tolerances of 1%, 2%, 3%, 5%, 10%, 20, and 25%.

A preferred embodiment of the present invention has the feature of being in a state of amorphous, nanocrystalline, or polycrystalline structure, either stoichiometric or not.

A preferred embodiment of the present invention has the feature of having been deposited at a temperature lower 250° C., notwithstanding a tolerance of 50° C.

A preferred embodiment of the present invention has the feature of having been annealed at a temperature lower than 300° C., preferably at 250° C., notwithstanding a tolerance of 50° C.

A preferred embodiment of the present invention has the feature of comprising said p-type material as insulator, further comprising oxygen incorporated in the structure of said material.

A preferred embodiment of the present invention has the feature of comprising said p-type material as conductive or p-type semi-conductive oxide, as a function of the amount of oxygen incorporated in the structure of said material.

A preferred embodiment of the present invention has the feature of comprising said p-type material as a contact with organic and inorganic p-type semiconductors.

A preferred embodiment of the present invention has the feature of further comprising impurities or additives for controlling the electronic properties, properties that comprise their electron deficit, impurities that comprise in particular zirconium or nitrogen, up to 20% of the total composition.

A preferred embodiment of the present invention has the feature of being a metal-insulator-semiconductor, MIS, -type diode, characterized in that the p-type semiconductor is said p-type material and comprising the corresponding metal on one side as n-type material and having the same material as insulator, with incorporated oxygen concentrations higher than 45%, or another organic or inorganic material, such as mylar or hafnia.

A preferred embodiment of the present invention has the feature of being a semiconductor heterojunction characterized in that said p-type material acts simultaneously as ohmic contact and as active element of the junction.

A preferred embodiment of the present invention has the feature of being a heterojunction characterized in that the n-type and p-type layers possess thicknesses in which the thicker oxide corresponds to the semiconductor with fewer number of free carriers, and the thinner oxide possesses a thickness of at least ten times smaller than the previous one and possesses free carriers at least ten up to a hundred times higher than the thicker oxide.

A preferred embodiment of the present invention has the feature of being an individualized or multi-layered or integrated p-type field effect transistor, characterized in that channel active layer is said p-type material.

A preferred embodiment of the present invention has the feature of being a p-type thin film transistor, TFT, characterized in that the p-type semiconductor is said p-type material.

A preferred embodiment of the present invention has the feature of being a CMOS or C-MESFET device characterized in that the p-type semiconductor is said p-type material.

A preferred embodiment of the present invention has the feature according to which the n-type semiconductor for the previous CMOS device is an inorganic covalent semiconductor, such as n-doped silicon, or ionic inorganic semiconductors, such as GTZO or AZTO, or organic semiconductors, or any of the possible hybrid combinations thereof.

A preferred embodiment of the present invention has the feature of further comprising a matching layer with silicon dioxide, or silicon nitride, or tantalum pentoxide, or polymeric films such as SU8, or combinations thereof, with thicknesses between 0.5 nm and 1000 nm.

A preferred embodiment of the present invention has the feature of further comprising a surface encapsulation and/or passivation layer, by means of a polymer, such as SU8, or magnesium fluoride, or silicon oxide, or silicon nitride, or combinations thereof.

A preferred embodiment of the present invention has the feature of further comprising a rigid substrate, such as ceramics or glass, or a flexible substrate, such as mylar, polymer, or paper.

A preferred embodiment of the present invention has the feature of further comprising a natural, synthetic, or mixed cellulose dielectric, referred to as cellulosic or bioorganic or paper material.

A preferred embodiment of the present invention has the feature of comprising thin films of cellulosic materials comprised by natural, synthetic, or mixed cellulose operable in order to provide physical support for the device, and to act as dielectric (3) of said device, making the device self-sustained.

A preferred embodiment of the present invention has the feature of comprising the use or incorporation of one or more of said elements in gates or logical devices, oscillators, records, controllers, inverters, actuators or drivers, flash memories, solar cells, diodes, light emitting diodes, radio identification devices RFID, or active matrices for displays and screens.

The present invention still describes a p-type material fabrication process, characterized by comprising the step of incorporating the previously mentioned p-type material.

A preferred embodiment of the present invention has the feature of comprising the deposition step of the material up to 250° C.

A preferred embodiment of the present invention has the feature of comprising the annealing step of the material up to 300° C.

A preferred embodiment of the present invention has the feature of comprising a physical, or physical-chemical, or chemical process, either using a vacuum or not, such as thermal evaporation, DC or RF sputtering, ink-jet printing, pulsed laser deposition, in order to manufacture films of amorphous or nanocrystalline or polycrystalline structure, with controlled composition, using growth rates between 0.01 nms-1-20 nms-1; process pressures between 105 Pa and 10-6 Pa; in atmospheres preferably containing argon, using partial pressures that vary between 10 Pa and 10-5 Pa, with or without oxygen and/or nitrogen, and/or fluorine, wherein the content of these additional gases may vary between 0.00-0.99 of the argon content, as a function of the energy process, preferably between 0.1 $Wcm^{-2}$-20 $Wcm^{-2}$, and of the distance between the source containing the material to be deposited and the substrate (1), preferably between 2 cm and 50 cm, and of the atmosphere being used, preferably containing argon.

A preferred embodiment of the present invention for the fabrication of electronic devices has the feature of further comprising the step of incorporating one or more previously mentioned elements and/or devices.

BACKGROUND OF THE INVENTION

The use of oxides in electronics and optoelectronics is well known, namely their applications as a passive element, as a transparent conductive electrode [1], or just as an anti-reflecting layer in different optoelectronic or optical devices [2], including their deposition at room temperature [3,4]. However, their application as an active semiconductor material is due to the initial work by H. Hosono [5], thereafter being confirmed in the production of devices, namely thin film transistors, at low or high temperatures [6,7,8] and their transport properties have been explored, namely concerning amorphous oxides [9]. Moreover, the use of active semiconductor oxides has been witnessed in the production of heterojunctions, namely in light emitting diodes [10], and other electroluminescent applications [11], with the use of p-type oxides for applications in active matrices or for producing CMOs-type devices or other type of logical devices, actuated at high or low voltage, being less well known. There are a few works, however, related to the use of $OCu_2$ produced at high temperature (above 500° C. and always polycrystalline), as channel region in TFT [12], quite distinct from the structure presented in the present invention. Published recent works are also known concerning p-type channel TFT based on SnO also produced at high temperatures (above 500° C. and always polycrystalline) [13], totally different from the system now proposed.

The use of compounds of the ($OCu$—$Cu_{1-2}$) and [($OSn_2$+$(Sn_{1-2})_w$ types, in their different electronic configurations, is known for applications such as electrical conductors, usually in the form of binary oxides, as referred to in the patent request US2006152138, whose application domain does not include the objects of invention of the present request.

The same happens with the patent application WO2005081055, that relates to the fabrication of stacked double layers of transparent conductive oxides (TCO) based on alumina-doped zinc oxide (AZO) or gallium-doped zinc oxide (GZO) or both (AGZO), or even a coating of indium and tin oxide (ITO), to be used in LCD or OLED flat panel displays or plasma displays, also including solar cells or other electronic devices, such as conductive electrodes, completely apart from the object of the present invention.

The patent JP2003324206 relates to the production of p-n junctions for photovoltaic applications wherein the p-type oxide is based on Copper-Aluminium, Copper-Gallium, Copper-Indium, and Copper-Strontium alloys, and the n-type oxide is selected from the tin, Indium, Titanium, and Zinc oxides or Gallium Nitride, which materials and compounds or alloys are totally different from the objects of creation of the present invention, in terms of materials and their applications, which focus on TFT or CMOS-type active devices and derivations thereof.

The patent US2002028571 refers to new zinc oxide alloys incorporating hydrogen and gallium, obtained by co-pulverization and processed at low temperatures, intended for transparent conducting electronic applications, thereby not involving either of the objects of creation and use of the present invention.

The patent JP2000045063 refers to the formation of indium-based transparent conductive oxides containing tin, zinc, or gallium, with thicknesses between 50 nm and 500 nm, to be deposited onto polymer substrates, such as electrical contacts, which is not the object of the present invention.

The patent WO2004/038757 (J. Wager/Oregon State University) concerns the use of oxide materials, such as zinc oxide (ZnO), tin dioxide ($SnO_2$), or indium oxide ($In_2O_3$) as an n-type active semiconductor in the fabrication of the TFT channel, not covering any of the objects claimed in the present invention.

The patent US2003/0218221A1 corresponds to the United States patent WO2004/038757 and is, therefore, completely different from the object of the present invention. The inventors of this patent claim the possibility of using additives for the ZnO and $SnO_2$ films from the periodic table of elements, such as Al, In, Ga, Bi, B, La, Sc, Y, Lu, Er, Ho, the films being processed at temperatures in the range of 100 to 500 centigrade degrees.

The patent US2005/0017244A1 claims the use of n-type oxides based on zinc oxide and tin dioxide, either doped or not, for producing the TFT channel region, the process temperature not being mentioned. Neither of these claims collides with the objects of the present invention.

The patent US2005/0199959 A1 (J. Wager and Oregon State University, OSU) refers to the use of n-type zinc and indium oxides and their alloys as active semiconductor in the production of electronic devices, including the production of the TFT channel region, completely different from the objects of the present invention.

The patent US2006/0079034 A1 (J. Wager and OSU) refers to the passivation of electronic circuits using $SiO_x$, $SiN_x$, $SiO_xN_y$, $GeO_xTaO_x$, $SiO_xC_y$, $YO_x$, $Mg_x$, and other materials, outside the object of the present invention.

The patent WO2005/088726 A1, (H. Osono) refers to the production of TFTs based on n-type amorphous oxides with a free carrier concentration of $10^{18}/cm^3$ or lower, this value being controlled through the oxygen partial pressure used during the fabrication process. The materials on which the oxides are based involve Ga—In—Zn; In—Ga—$Zn_{1-x}$—$Mg_x$, or Ga—Zn—Sn, using ceramic targets and process temperatures around 1000° C., using fabrication techniques such as pulsed laser deposition, PLD. In addition to the above mentioned oxides, the authors also claim the following compositions of metal oxides, either doped or not with impurities: $In_xGa_{1-x}$ (0≤x≤1), $In_xZn_{1-x}$ (0.2≤x≤1), $In_xSn_{1-x}$ (0.8≤x≤1), $In_x(Zn,Sn)_{1-x}$ (0.15≤x≤1) or [$(Sn_{1-x}M4_x)O_2$]a. [$(In_{1-y}M3_y)_2°_3$] b. [$(Zn_{1-z}M2_z)O$]c. [0≤x≤1, 0≤y≤1, 0≤z≤1, 0≤a≤1, 0≤b≤1, 0≤c≤1], being considered as impurities the following elements to be incorporated:
Pentavalent impurities M5: V, Nb, Ta.
Tetravalent impurities M4: Si, Ge, Zr;
Trivalent impurities M3: B, Al, Ga, Y;
Divalent impurities M2: Mg and Ca.

This patent partially relates to the same type of electronic devices, such as TFT, simply referring to n-type devices whose charge transport is controlled by electrons, thereby not considering p-type devices whose transport is controlled by holes.

The patent JP2006165527A, also by H. Osono, corresponds to an update of the previous patent, being also claimed the low temperature fabrication of these devices and thus, like the previous patent, it does not collide with the object of the present invention.

The pending patent PCT/PT2007/000008 concerns the use of p-type and n-type multicomponent oxides based on copper, nickel, and Gallium-Tin-Zinc-Copper-Titanium, not included in the object of the present invention.

In addition, several scientific papers concerning devices based on zinc oxide [7], zinc-doped indium oxide [8], tin-doped zinc [13], Gallium-Zinc-Indium-Oxygen multicomponent oxides [5,14] are known.

As far as patents related to p-type oxides are concerned, the majority refers to p-type oxides of zinc oxide, such as the cases of the patent applications or patents WO2009120024 and KR20090024767; the patent applications or patents KR20080086335 and US2008118769, related to the zinc oxide production method; the patent applications or patents CN1913174 and US2006233969, related to the patent application US2006233969, also concerning p-type zinc oxides and their possible combinations with semi-conductive compounds of the II-VI groups, not related to the objects of the present invention.

The pending patent CN101355031 refers to the method for the preparation of $CuCrO_2$ p-type transparent oxides, not related to the objects of the present invention.

The pending patent CN101308109 refers to p-type delafossite based on Copper-Iron-Oxygen, either doped or not, for application in ozone sensors and fabrication methods involved, not included in the objects of the present invention.

The patent CN101260507 refers to the sintering process of ceramic targets of p-type semiconductors based on copper-doped nickel oxide, processed at very high temperatures, and the preparation method thereof, not included in the objects of the present invention.

The patent application or patent H01L27/02B2 refers to the fabrication of layers involved in the production and method for Metal-Oxide-Semiconductor Complementary devices in order to form, for example, the p-type metal oxide transistor, with the formation of active zones in the semi-conducting layer through the opening of appropriate windows where the base material, which is zinc oxide, is annealed, in order to render it p-type, the entire process being conducted at high temperatures, not related to the objects of the present invention in terms of methods, materials and process temperatures.

The pending patent KR20080064592 refers to the composition of p-type transparent oxides, quite dissimilar from the materials that are object of the present invention.

The pending patent CN201038163 refers to semiconductor tubes based on metal oxides for application in high voltage p-type grid devices, quite dissimilar from the objects of the present invention.

The pending patents EP1240941, JP03047966, JP405074653, JP06326104 refer to the catalytic preparation of p-type copper and aluminum semiconductor oxides, these materials being quite dissimilar form the ones that are object of the present invention.

The pending patent KR20070105002 refers to p-type metal oxides and fabrication methods thereof, not coincident with the methods and materials that are object of the present invention.

The pending patent CN2938408 refers to p-type metal oxides for applications in high voltage semi-conductive devices, not related to the objects of the present invention.

The pending patent KR20020028476 refers to the fabrication method of p-type semiconductor oxides which does not include the production methods of the non-stoichiometric monoxides of the present invention, both having in common the fact of using high dielectric constant dielectrics.

The pending patent KR20020002065 refers to the fabrication method of p-type oxide-based transistors, involving processes and materials dissimilar from the objects of the present invention.

The pending patent WO2006012444 refers to p-type metal oxide semiconductor field effect transistors (PMOSFET) in enhancement mode operation in which the active layer is the p-type semiconductor oxide, based on SRAM-type cells, while the patent G11C11/412 also refers to the same type of device, quite dissimilar from the objects of the present invention.

The pending patent US2005151164 refers to field effect transistors based on p-type metal oxides in enhancement mode operation whose structure includes a tensile strained thin layer (first thickness) disposed over the substrate between which another compressed layer is disposed (second thickness), whose thicknesses allow controlling the mobility and type of charge carriers, quite distant from the operating objects of the present invention.

The pending patent CN1487594 refers to semiconductor metal oxides in the form of p-type nanotubes or tubes for applications in high voltage devices, dissimilar from the objects of the present invention.

The pending patent US2003057495 and other related patents refer to copper-aluminum p-type semiconductor oxides, processed at high temperatures, for essentially passive applications, bearing nothing in common with the objects of the present invention.

The pending patent JP2001322814 refers to p-type oxides and fabrication method thereof not included in the materials and process conditions that are object of the present invention.

The pending patent TW428235 refers to the fabrication method of p-type oxides, dissimilar from the ones of the present invention.

The pending patent JP11162971 refers to the fabrication method and production of p-type oxides, not involving the materials that are object of the present invention.

Materials related to the present invention are the SnO oxides processed at high temperatures (around 575° C.) [1, 2], not including metal Sn embedded in their structure, with the consequence that the material cannot be processed at quite lower temperatures, in amorphous or polycrystalline structures, because the material is always polycrystalline in reference 13. On the other hand, the initial target can be a metallic, which is not the case in the previously cited reference.

The other known result closer to one of the objects of the present invention is the use of copper monoxide, processed at a temperature above 600° C., for the TFT channel layer [12] but not exhibiting the presence of any Cu metal cation, neither the room temperature processing of structures, presenting amorphous or polycrystalline structures. In addition, the use of NiO as p-type material in the production of p-n junctions is known [3], also processed at very high temperatures, but nothing is known about their use in bulk structures containing Sn and Ni alloys or metal elements as p-type channel in the fabrication of TFT.

GENERAL DESCRIPTION OF THE INVENTION

The present invention relates to the method and use of non-stoichiometric binary, ternary, and quaternary multicomponent metal oxides with metal species from the predominant component embedded in their structure in order to produce p-type oxides manufactured at room temperature, or preferably at temperatures about 250° C., with an amorphous, nanocrystalline, or polycrystalline structure, whose control form corresponds to the subsequently enumerated examples from A to C, involving typical cases of preferably non-stoichiometric tin, copper, and nickel monoxides, and respective alloys, as listed below, or combinations thereof:

a) Preferably non-stoichiometric Copper monoxide with Cu metal species embedded in its structure $[(OCu_2)_x + (Cu_{1-2})_y$, wherein $0.05 \leq x < 1$ and $0.01 \leq y \leq 0.9]$;

b) Preferably non-stoichiometric tin monoxide with Sn metal species embedded in its structure $[(OSn)_z + (Sn_{1-2})_w$, wherein $0.05 \leq z < 1$ and $0.01 \leq w \leq 0.9]$;

c) Preferably non-stoichiometric copper and tin alloy monoxide with Cu and Sn metal species contained in its structure, in single form or as an alloy $[(O\text{—}Cu\text{—}Sn)_a + (Cu_\alpha\text{—}Sn_\beta)_b$, with $0 < \alpha < 2$ and $0 < \beta < 2$, wherein $0.05 \leq a < 1$ and $0.01 \leq b \leq 0.9]$;

d) Preferably non-stoichiometric nickel monoxide with Ni and Sn metal species contained in its structure, in single form or as an alloy $[(O\text{—}Ni)_a + (Ni_\alpha\text{—}Sn_\beta)_b$ with $0 < \alpha < 2$ and $0 < \beta < 2$, wherein $0.05 \leq a < 1$ and $0.01 \leq b \leq 0.9]$.

Once processed, the films can be annealed at temperatures preferably up to 300° C., exhibiting an amorphous, or nanocrystalline, or polycrystalline structure, as a function of the composition and metal constituents being used.

The properties of the above mentioned films can be controlled, from an insulating behavior to a semiconductor behavior or even an electric conductor-type behavior, as a function of the amount of oxygen and metal species incorporated in the structure, as exemplified from A to C for the cases of tin, copper, and nickel monoxides, allowing the control of the electrical conductivity, namely from $10^{-14}$ S·cm$^{-1}$ to $10^5$ S·cm$^{-1}$.

Controlling the properties of these materials included in this invention, essentially involving the non-stoichiometric p-type semiconductor oxides based on tin, copper, and nickel, obeys the fabrication methods for the compounded mixtures described hereafter:

A—Controlling the Electrical Properties of the Oxide Material Based on Tin Alloys Deposited at Low Temperatures (<250° C.)

The better known stoichiometric tin oxide is SnO$_2$, typically presenting an n-type behavior where the transport of free carriers is mainly controlled by oxygen waves. For the compositions outside the stoichiometry, however, the transport properties of those oxides may vary strongly, with the deviation ($\Delta x$) depending on the existing native disorder and on the nature and concentrations of atoms and defects involved.

Considering the case of tin monoxide SnO (originated from the so-called tin α, Sn$_\alpha$), where a more critical free carrier balance can be predicted, the stoichiometry deviation can be given by the relation:

$$SnO_{1+\Delta x}$$

Whenever the tin oxide has an oxygen excess (tin components deficit), the stoichiometry deviation is positive, that is, $\Delta x > 0$. In the opposite case, that is, tin oxide presents an oxygen deficit (excess of metal components, that is, the so-called tin β, Sn$_\beta$), $\Delta x < 0$ Here, the defects and their nature have a decisive role, such as interstitial oxygen and atoms of Sn$_\beta$, respectively represented by $O_i^x$ and $Sn_i^x$, in their neutral (x) or charged (+ or −) forms; structural anti-defects, created by oxygen atoms incorporated in some sites of the Sn$_\beta$ sub-lattice and Sn$_\beta$ atoms incorporated in some sites of the O sub-lattice, respectively represented by $O_M^x$ and $Sn_O^x$, in their neutral (x) or charged (+ or −) forms; empty places in the tin sub-lattice ($V_{Sn}$) and oxygen sub-lattice ($V_O$), in their neutral (x) or charged (+ or −) forms.

Most of the point defects can be due to partially or totally ionized vacancies, leading to localized states inside the band gap of the oxide.

Although oxygen vacancies are related to the ionized positive donors, behaving like donor atoms localized near the bottom part of the conduction band, the void associated with a tin atom corresponds to withdrawing a Sn$^{2+}$ together with both electrons from the cation sub-lattice, leading to the formation of holes (empty states) in the valence band. That is to say, the total ionization of $V_{Snx}$ leads to the formation of an energy band level located near the top of the valence band which, for temperatures above absolute zero, is partially filled with electrons coming from the valence band, according to the reaction:

$$V_{Sn}{}^* = V_{Sn}{}^- + h^+ \text{ or } V_{Sn}{}^* = V_{Sn}{}^{2-} + 2h^+, \qquad (1)$$

which oxidation reaction, due to oxygen gas, is given by:

$$O_2{}^g = 2O_O{}^x + V_{Sn}{}^- + V_{Sn}{}^{2-} + 3h^+, \qquad (2)$$

wherein the concentration of tin atoms will satisfy the relation:

$$[V_{Sn}] = [V_{Sn}{}^-] + [V_{Sn}{}^{2-}]. \qquad (3)$$

The appearance of these defects, with random distribution, together with the totally ionized tin vacancies can result in the deformation of bands located near the valence band and, thus, result in the formation of a band of negatively charged acceptor states. This condition leads to the formation of p-type semiconductor oxide, characterized by the admixture of the $Sn_\beta$ and $SnO_\alpha$ tetragonal phases.

In this way, for the formation of $(SnO_\alpha)_x$ and considering tin vacancies and related defects, the following reactions may occur:

$$(SnO_\alpha)_x \leftrightarrow \qquad (4a)$$
$$Sn_{\beta x}^{2+} + 2V_{Sn}^- + \tfrac{1}{2}O_2 \text{ (leads to the formation of a hole per}$$
$$\text{totally ionized tin vacancy);}$$

$$(SnO_\alpha)_x \leftrightarrow Sn_{\beta x}^{2+} + V_{Sn}^{2-} + \qquad (4b)$$
$$\tfrac{1}{2}O_2 \text{ (formation of two holes per totally ionized tin vacancy);}$$

$$(SnO_\alpha)_x \leftrightarrow Sn_{\beta x}^{2+} + V_{Sn}^- + O_{Sn}^- + \tfrac{1}{2}O_2 + \qquad (4c)$$
$$V_O^+ \text{ (formation of two holes per tin vacancy and totally ionized,}$$
$$\text{charged intra-structural oxygen defects);}$$

$$(SnO_\alpha)_x \leftrightarrow Sn_{\beta x}^{2+} + V_{Sn}^- + \qquad (4d)$$
$$O_{Sn}^- \text{ (formation of two holes per totally ionized tin vacancy);}$$

$$SnO_{\alpha x} \leftrightarrow \qquad (4e)$$
$$Sn_\beta^{3+} + 3V_{Sn}^- + \tfrac{x}{2}O_2 \text{ (leads to the formation of 3 holes per totally}$$
$$\text{ionized tin vacancy);}$$

$$SnO_{\alpha x} \leftrightarrow \qquad (4f)$$
$$Sn_{\beta x}^{3+} + V_{Sn}^{2-} + V_{Sn}^- + \tfrac{x}{2}O_2 \text{ (leads to the formation of 3 holes}$$
$$\text{per totally ionized tin vacancy);}$$

$$SnO_{\alpha x} \leftrightarrow Sn_\beta^{3+} + Sn_\beta^{2+} + V_{Sn}^{2-} + V_{Sn}^- + O_{Sn}^{2-} + \qquad (4g)$$
$$\tfrac{x}{2}O_2 \text{ (leads to the formation of 4 holes per set of tin impurities}$$
$$\text{and totally charged intra-structural oxygen defects);}$$

$$SnO_{\alpha x} \leftrightarrow Sn_\beta^{3+} + Sn_\beta^{2+} + yV_{Sn}^{2-} + zV_{Sn}^- + wO_{Sn}^{2-} + aO_O^{2-} + bV_O^{2+} + \qquad (4h)$$
$$\tfrac{x}{2}O_2 \text{ (leads to the formation of } y+z+w \text{ holes and } a +$$
$$b \text{ electrons, wherein } y+z+w >> a+b).$$

Generally speaking, the deviation from stoichiometry when all non-associated native atomic defects are present can be described by the following formula:

$$\Delta x = \frac{\lfloor \overline{O}_i \rfloor + \lfloor \overline{O}_{Sn} \rfloor + \lfloor \overline{V}_{Sn} \rfloor - \lfloor \overline{S}n_i \rfloor - \lfloor \overline{S}n_O \rfloor - \lfloor \overline{V}_O \rfloor}{N_0} \qquad (5)$$

wherein $[V_{Sn}](\overline{V}_{Sn}=[V_{Sn}^x]+[V_{Sn}^-]+[V_{Sn}^{2-}]+[V_{Sn}^{3-}])$ and $[V_O](\overline{V}_O=[V_O^x]+[V_O^+]+[V_O^{2+}])$ are the total average concentration of vacancies in the oxygen and tin sub-lattices, respectively; $N_0$ is the number of available places in each (oxygen and tin) sub-lattice per cubic centimeter.

From what was previously stated, we conclude the following:

a) In order to retain the metal character, the $Sn_\beta$ concentration in the structure should exceed the one of the $SnO_{\alpha x}$ aggregates. That is, the metal character is maintained when, during the fabrication process, there are no oxidizing species present (percentage of oxygen partial pressure, $P_{pO}$ practically zero in the argon admixture) or preferably $P_{pO}<5\%$.

b) In order to achieve a p-type semiconductor character it is important that any of the previously described conditions are fulfilled. That is, the matrix lattice of the oxides should present $Sn_{\beta x}$ species, with $x>0$ and $x<1$, and $SnO_{\alpha x}$ species wherein $x>1$ and $x<2$. That is to say, tin monoxide-type species are out of stoichiometry. For instance, that can be achieved if preferably $5\%<P_{pO}<15\%$ and $Sn_{\beta x}<0.25$. Outside this window, the $SnO_{\alpha x}$ species are no longer dominant and the p-type semiconductor character is no longer observable, with the semiconductor presenting an n-type character. This part of the study is embodied in the appended article draft.

This very same window moves to the right (for example, $15\%<P_{pO}<25\%$) in equal intervals with increasing $Sn_{\beta x}$ (e.g. for values below 0.7). In the latter case, the transparency of the semiconductor is drastically reduced with increasing number of $Sn_\beta$ species.

c) For the oxide to have insulating characteristics, the condition to be fulfilled is preferably that species of $Sn_{\beta x}<0.05$ and that there is an excess of incorporated oxygen species, balancing the highest possible number of vacancies and voids left by tin atoms in the Sn sub-lattice. That can be achieved whenever preferably $P_{pO}0>42\%$.

B—Controlling the Electrical Properties of the Oxide Material Based on Copper Alloys Deposited at Low Temperatures (<250° C.)

I. The way semiconductor oxides can be obtained, mainly controlled by copper cationic species, is similar to the previous one but now the admixtures will be based on metal copper in cubic tetragonal form $(Cu_{cx})$, wherein $x>1$ and $x<2$, and the oxide species will be of the $Cu_{cx}O_{1-x}$ type, which in the limit tends to the stoichiometric cubic form $(Cu_2O)_{cx}$, with each oxygen atom tetrahedrally bonded to four Cu atoms, where the species with monoclinic structure due to CuO are a minority. In this context, obtaining copper oxides with semiconductor characteristics will be a function of the $Cu^{2+}$ and $Cu^+$ species present in the oxide and, thus, of the ratio $C \cong [Cu^{2+}/(Cu^{2+}+Cu^+)]$ and therefore of the Cu oxidation state and the nature of existing structural defects, namely of copper vacancies and oxygen interstitials, either ionized or not, respectively $V_{Cu x}^y$ and $O_i^y$ (with $y=0$ or $y=+$). For example, $V_{Cu x}$ associated with the removal of one $Cu^{2+}$, together with two electrons coming from the copper cationic sub-lattice, promotes the formation of holes (h, empty energy state) in the Cu valence band, according to the general quasi-chemical reaction:

$$V_{Cu}{}^* = V_{Cu}{}^- + h^+ \text{ or } V_{Cu}{}^* = V_{Cu}{}^{2-} + 2h^+, \qquad (6)$$

that is, the Cu vacancy acts as an electron acceptor impurity, whose oxidation reaction due to oxygen gas is given by:

$$O_2{}^g = 2O_0{}^x + V_{Cu}{}^- + V_{Cu}{}^{2-} + 3h^+, \qquad (7)$$

wherein the concentration of copper and oxygen voids should satisfy the relation:

$$[\overline{V}_{Cu}] = [V_{Cu}{}^-] + [V_{Cu}{}^{2-}] \text{ and }$$
$$\overline{V}_O = [V_O{}^x] + [V_O{}^+] + [V_O{}^{2+}]. \qquad (8)$$

Since, in addition to acceptor centers there are also donor centers, associated with oxygen vacancies $V_O{}^{2-}$, generally speaking, the general quasi-chemical reaction can be represented by the equation:

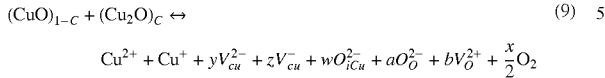

$$(CuO)_{1-C} + (Cu_2O)_C \leftrightarrow Cu^{2+} + Cu^+ + yV_{cu}^{2-} + zV_{cu}^- + wO_{iCu}^{2-} + aO_O^{2-} + bV_O^{2+} + \frac{x}{2}O_2 \quad (9)$$

wherein $O_{iCu}^{2-}$ corresponds to defects created by oxygen atoms incorporated in interstitials of the copper lattice; $O_O^{2-}$, that leads to the formation of y+z+w holes and a+b electrons, wherein y+z+w>>a+b, as a function of:

$$\Delta x = \frac{[\overline{O_i}] + [\overline{O_{iCu}}] + [\overline{V_{Cu}}] - [\overline{Cu_i}] - [\overline{Cu_O}] - [\overline{V_O}]}{N_0}, \quad (10)$$

wherein $[\overline{O_i}]$, $[\overline{O_{iCu}}]$ and $[\overline{Cu_i}]$, $[\overline{Cu_O}]$ correspond respectively to the average concentration values of interstitial oxygen and copper atoms; $N_0$ is the number of places in each of the sub-lattices per cubic centimeter.

II. p-Type semiconductor oxides: The monoclinic $(CuO)_{mx}$ form does not result in the formation of the desired species that lead to the formation of the band of localized states above the valence band, required for a p-type semiconductor oxide, at least for temperatures below 400° C. In this specific case, the process window widens: preferably 5%<$P_{pO}$<55% and $Cu_{cx}$>1.25 (representing a percentage of incorporation in the final composition of the admixture, preferably lower than 35% and in which the monolithic copper oxide species are always lower than the copper oxide in cubic form by a factor of at least 1.5).

III. Oxides with metal characteristics at low temperatures are preferably obtained when $Cu_{cx}$<1 (representing preferably a percentage of incorporation in the final composition of the admixture above 35%) and preferably $P_{pO}$<5%.

IV. Insulating material of copper oxides is obtained, in monolithic or cubic form, whenever the incorporation percentage of oxide is preferably higher than 80% and the single preferably metallic species incorporated in the admixture are lower than 10%. That is to say, the window for obtaining these oxides as electrical insulating materials is much narrower.

C—Controlling the Electrical Properties of the Oxide Material Based on Nickel Alloys Deposited at Low Temperatures (<250° C.)

The properties and procedure for obtaining oxides with metallic, p-type semiconductor, and insulating characteristics follow the same lines enumerated for tin, but with much wider windows:

a) In order to retain the metal character, the Ni concentration in the structure should preferably exceed the $NiO_x$ aggregates. That is, the metal character is maintained whenever, preferably during the fabrication process, there are no oxidizing species (percentage of oxygen partial pressure $P_{pO}$ zero in the argon admixture) or whenever preferably $P_{pO}$<3%.

b) In order to achieve a p-type semiconductor character it is important that any of the previously described conditions are fulfilled. That is to say, the matrix lattice of the oxides presents $Ni_x$ species, with x>0 and x<1, and $NiO_x$ species, wherein 0<x<1. That is, nickel monoxide-type species are out of stoichiometry. For instance, that can be achieved if 5%<$P_{pO}$<45% and $Ni_x$<0.20. Outside this window, the $NiO_x$ species leading to the p-type character of the oxide are no longer dominant and the semiconductor is no longer p-type, with the semiconductor presenting an n-type character or p-type extrinsic metal contact. This very same window shifts to the right (e.g. 15%<$P_{pO}$<75%) in equal intervals with increasing $Ni_x$ (for instance, for values below 0.75). In the latter case, the transparency of the semiconductor is drastically reduced with increasing number of ni species.

c) For the oxide to have insulating characteristics, the condition to be fulfilled is preferably that species of $Ni_x$<0.05 and that there is an excess of incorporated oxygen species, balancing the highest possible number of vacancies and voids left by tin atoms in the Sn sublattice. That can be achieved whenever preferably $P_{pO}$>70%.

For example, for films processed by the PVD and CVD techniques, this control can be achieved through the percentage of the oxygen partial pressure ($P_{pO}$) in the Argon admixture present during the production process of the films, as previously exemplified.

The above mentioned films may contain other additives in proportions preferably lower than 1% of the above enumerated compositions, in order to control their electronic performance, mainly as either transparent or non-transparent conductive oxides, in which the impurity allows controlling the electron deficit presented by these materials (behavior of acceptor-type materials).

The objective is to use these films in the fabrication processes of electronic and optoelectronic devices, either as passive semiconductor, in which these materials are used to produce ohmic contacts, or as active semiconductors, to be used in the production of the channel region of thin film transistors with different geometries and configurations (see FIGS. 3 to 5) and deposited onto rigid substrates, such as glass, or flexible ones, such as polymer or paper, some examples being presented in FIGS. 12 to 17, or as p-type active semiconductor component to be used in the production of C-MOS devices, as illustrated in FIG. 1, or in the production of p-n or MIS type junctions, as illustrated in FIG. 18, in which the above mentioned films are incorporated, always processed at room temperature or temperatures preferably below 250° C., and which can be annealed at preferably maximum temperatures of 250° C., either in terms of processed films or manufactured devices, where it will also act to optimize the quality of the produced ohmic contacts.

For the above mentioned applications, the films will have thicknesses that preferably vary between 10-10000 nm in case the selected application is as conductive oxide, or 1-1000 nm in case the selected application is as active semiconductor (production of the channel region) in devices such as TFT or C-MOS.

The proposed p-type oxides can be manufactured in different composition ranges, as a function of the application domain intended, in any type of substrate, from rigid substrates, such as glass or passivated metal foils or treated ceramic surfaces, to flexible substrates, such as polymer or paper, using different deposition methods, such as physical, physical-chemical, and chemical methods, an example being resistive thermal evaporation (FIG. 8) or electron gun evaporation (FIG. 9); pulverization (FIG. 10); ink-jet printing (FIG. 11); with or without the presence of UV light, in order to create films with controlled composition, highly compact, amorphous, nanocrystalline, or polycrystalline, using growth ratios that vary between 0.01 nms$^{-1}$ and 20 nms$^{-1}$, as a function of the energy used in the deposition process (0.1 Wcm$^{-2}$ to 20 Wcm$^{-2}$) and of the distance between the source (the place where the inlet for the materials to be deposited is located) and the substrate, that can vary between 1.5 centimeters and 50 centimeters, under different atmospheric conditions, such as pure argon or argon in admixture in different proportions with oxygen, or nitrogen and hydrogen, using pressures for deposition processes that may vary from $10^5$ Pa to $10^{-6}$ Pa, using oxygen partial pressures that may vary from $10^3$ Pa to $10^{-5}$ Pa, with or without the presence of hydrogen, or nitrogen, or fluorine, in proportions that may vary from 0.00 to 0.99 of the oxygen amount being used, wherein the materials or the devices may be annealed after their production at temperatures that may vary preferably between 50° C. and 250° C., as a function of the type of substrate that is selected, for times that may vary between 20 minutes and 10 hours.

The new p-type semi-conducting oxides previously mentioned from a) to d) can be used in the processing of active devices, such as TFT or C-MOS or p-n or MIS junctions, involving either other types of n-type semiconductor or covalent n-type semiconductor oxides, such as phosphor or gallium arsenide-doped silicon, in enhancement mode or depletion mode operation. That is to say, there is no current flow through the device without an external voltage being applied between the drain and source regions of the device, independently of the gate voltage applied, or there is current flow between the drain and the source without any bias voltage being applied between the drain and source regions when a gate voltage is applied to the device.

DESCRIPTION OF FIGURES

For an easier understanding of the invention the figures are appended, representing preferred embodiments of the invention that, however, are not intended to limit the object of the present invention.

33—Evaporating beam.

Figure 10:
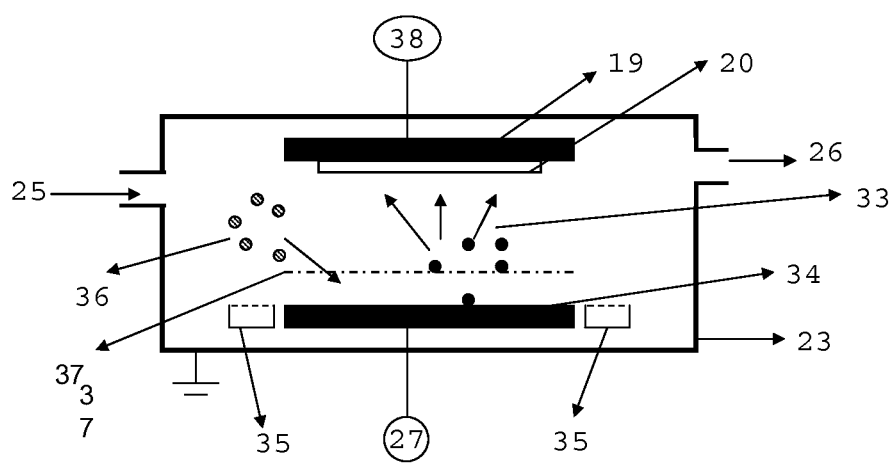

FIG. 10—General schematic representation of a sputtering process, according to the previous legends and the one of the figure:
- 34—Electrode where the radio frequency continuous or alternating energy signal is to be applied, containing the target (cathode), with the possibility of being laterally surrounded by a magnetic field;
- 35—Injector of reactive gas, such as oxygen, located close to the target and comprised by non-conducting material;
- 36—Ionized gas species, such as argon;
- 37—Bias mesh;
- 38—Substrate bias.

Figure 11:
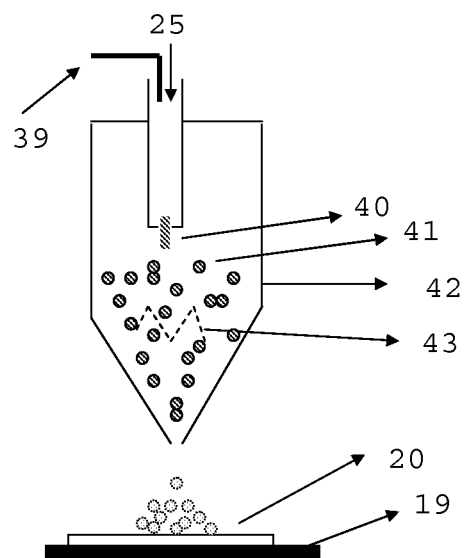

FIG. 11—Film production system by ink-jet printing, wherein their components are according to the previous legends and to the legend:
- 39—Inert gas injection inlet, in order to confine the chemical solution towards the atomizer;
- 40—Atomizer;
- 41—Nanodrops of the atomized solution;
- 42—Vessel/container of the ink-jet system, containing a particle atomizer, the chemical solution to be controllably pulverized onto a substrate, and the heating system;
- 43—Heating resistance/bias.

Figure 12:
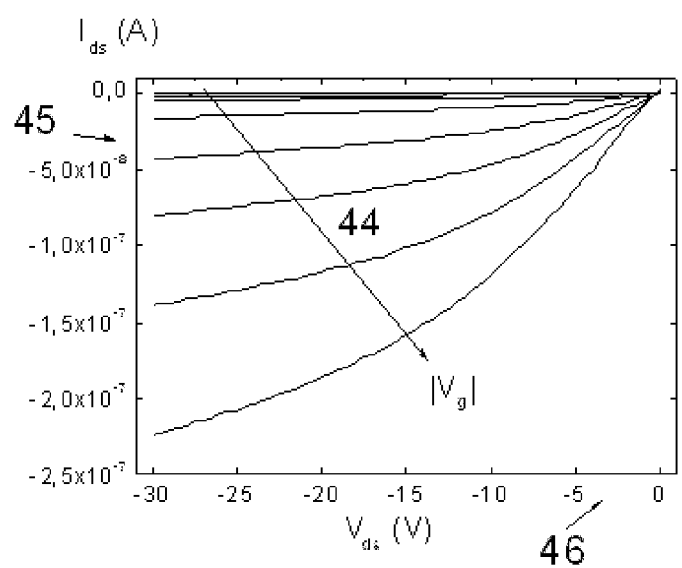
Figure 12:

FIG. 12—Representation of the characteristic output curve (drain current as a function of the drain-source voltage, using the gate voltage as parameter) of a p-type TFT based on $(OCu_2)_x$—$(Cu_{1-2})_y$ structures, wherein $0.05 \leq x < 1$ and $0.01 \leq y \leq 0.9$], as shown in the inset on top of the image of the figure for the material, and showing that this is a transparent one in the inset on the bottom of the figure, for devices processed over glass, with ITO as gate electrode and ATO as dielectric, and in which the source and drain are comprised by metal films (gold), for different gate voltages, in which the gate electrode is grounded, according to the following legend:
- 44—Parametrized curves as a function of the gate voltage used, with steps of 10 V per curve, starting at a gate voltage of −55 Volts and ending at +5 Volts;
- 45—Representation of the drain current scale, wherein each major division corresponds to $-5 \times 10^{-8}$ A, with the origin corresponding to 0 A;
- 46—Representation of the drain-source voltage scale, wherein each major scale corresponds to −5 Volts, with the origin at 0 Volts.

Figure 13:
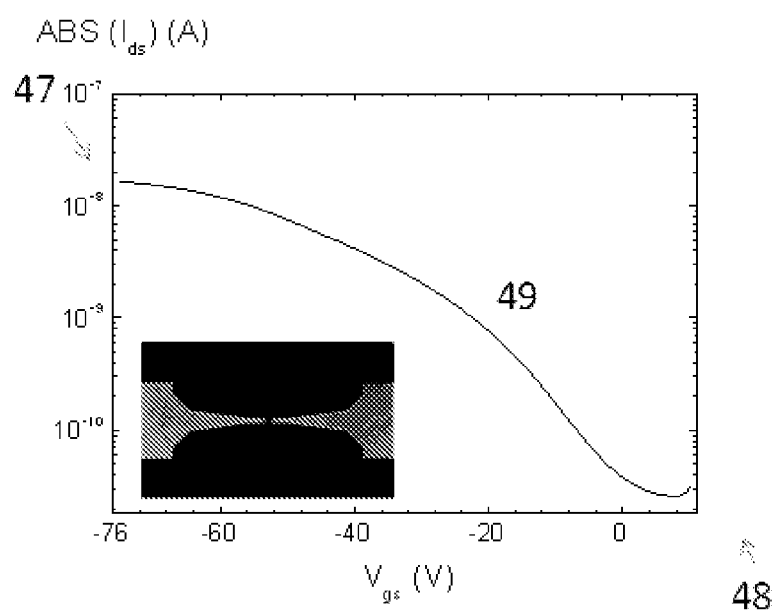

FIG. 13—Transfer curve of the drain-source current as a function of the gate-source voltage, for a fixed drain voltage of −2 Volts of the device depicted in FIG. 12 with the aspect ratio of 25 μm/25 μm, according to the numbering of the legend:
- 47—Representation of the drain current scale wherein each major division corresponds to a decade, with the origin at $10^{-7}$ A;
- 48—Representation of the gate-source voltage scale wherein each major division corresponds to −20 Volts, with the origin at 76 Volts;
- 49—Representation of the transfer curve, wherein the ratio between the smaller current and larger current flat regions is higher than $10^3$, the voltage corresponding to the transition between the on and off states is −1 Volts and the saturation mobility is 0.05 $cm^2V^{-1} s^{-1}$.

Figure 14:
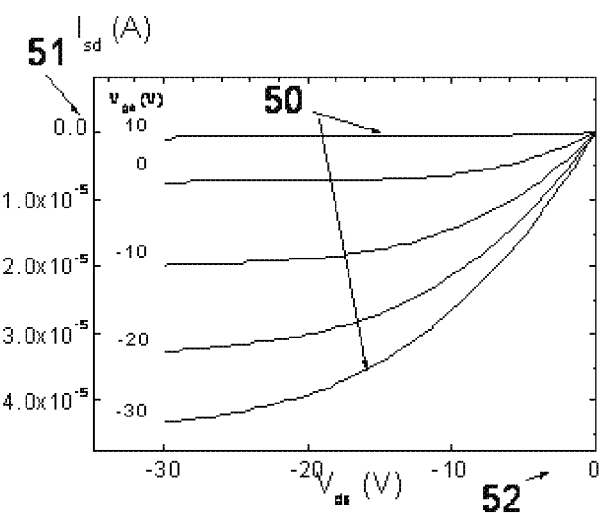
Figure 14:
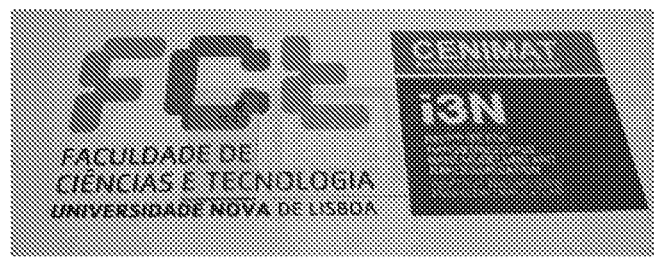

FIG. 14—Representation of the characteristic output curve (drain current as a function of the drain-source voltage, using the gate voltage as parameter) of a p-type TFT based on $[(OSn)_z+(Sn_{1-2})_w$ structures, wherein $0.05 \leq z < 1$ and $0.01 \leq w \leq 0.9$], as shown in the inset on top of the figure for the material being used, and showing that this is a transparent one in the inset on the bottom of the figure, for devices processed over glass, with ITO as gate electrode and ATO as dielectric, and in which the source and drain are comprised by metal films (gold), for different gate voltages, in which the gate electrode is grounded, according to the following legend:
- 50—Parametrized curves as a function of the gate voltage used, with steps of 10 V per curve, starting at a gate voltage of −30 Volts;
- 51—Representation of the drain current scale wherein each major division corresponds to $-1 \times 10^{-5}$ A, with the origin corresponding to 0;
- 52—Representation of the drain-source voltage scale, wherein each scale division corresponds to −2 Volts, with the origin at 0 Volts.

Figure 15:
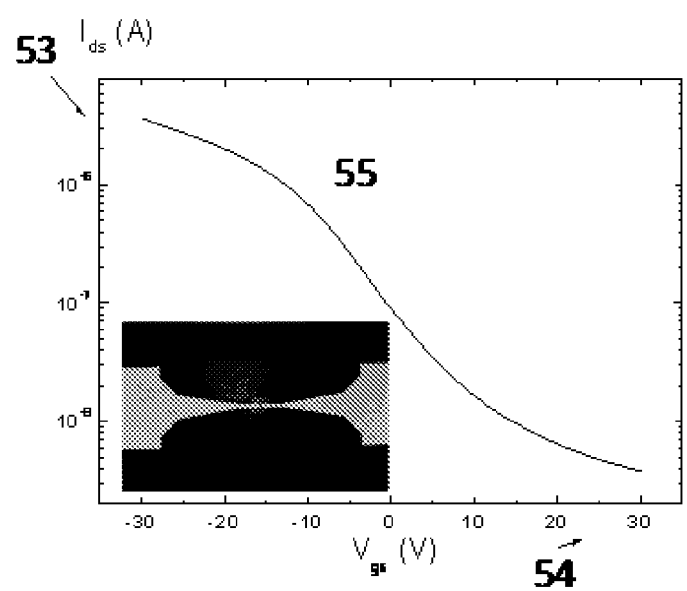

FIG. 15—Drain-source current transfer curve as a function of the gate-source voltage, for a fixed drain voltage of −1 Volts of the device depicted in FIG. 14 with the aspect ratio of 50 μm/40 μm, according to the numbering of the legend:
- 53—Representation of the drain current scale wherein each major division corresponds to a decade, with the origin at $10^{-15}$ A;
- 54—Representation of the gate-source voltage scale wherein each major division corresponds to −10 Volts, with the origin at 0 Volts;
- 55—Representation of the transfer curve, wherein the ratio between the smaller current and larger current flat regions is higher than $10^4$, the voltage corresponding to the transition between the on and off states is lower than −1 Volts and the saturation mobility is larger than 1.4 $cm^2V^{-1} s^{-1}$.

Figure 16:
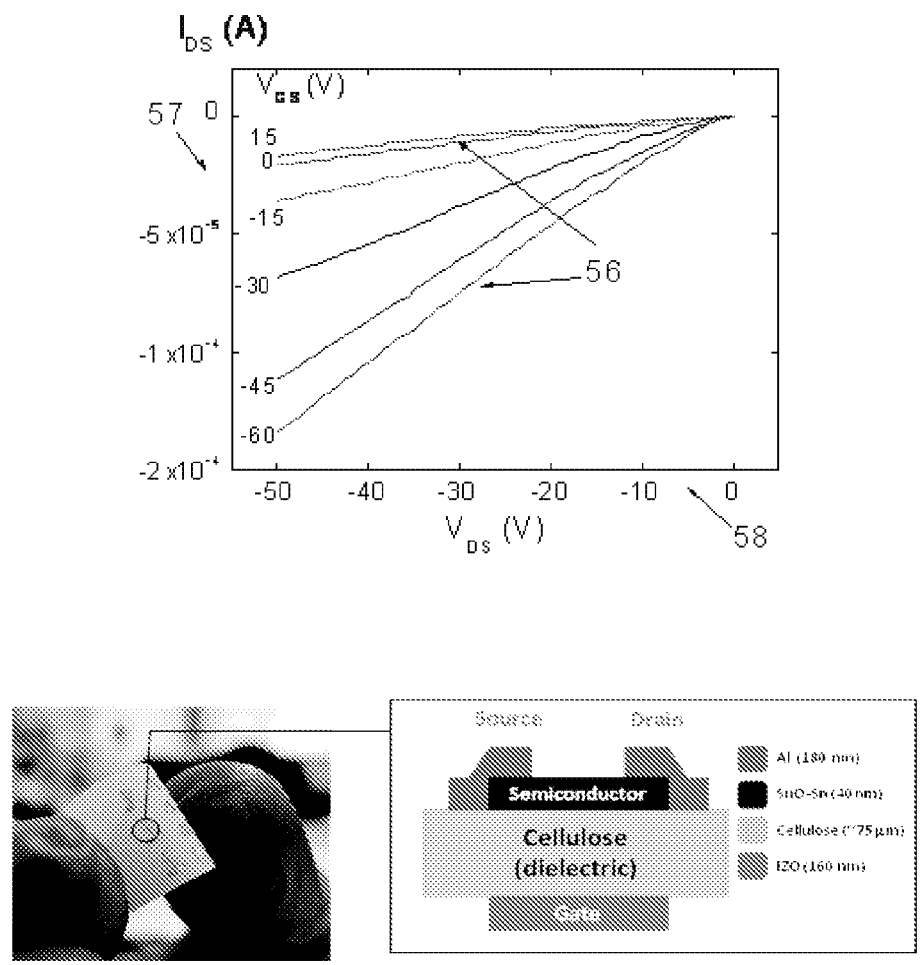

FIG. 16—Characteristic output curve of a p-type oxide TFT based on non-stoichiometric tin monoxide with embedded metal Sn species $[(OSn)_z+(Sn_{1-2})_w$ wherein $0.05 \leq z < 1$ and $0.01 \leq w \leq 0.9$], as shown in the inset of the figure, of an actual device processed on cellulose paper acting simultaneously as substrate and dielectric, with an IZO film as gate electrode and wherein the drain and source regions are based on gold metal films, for different gate voltages, in which the gate electrode is grounded, according to the following legend:
- 56—Parametrized curves as a function of the gate voltage $V_G$, with steps of 15 Volts, starting at −60 Volts;
- 57—Representation of the drain-source current scale, wherein each scale division represents $5 \times 10^{-5}$ A, with the origin at 0 Amperes;
- 58—Representation of the drain-source voltage scale, wherein each major scale division represents 10 Volts, with the origin located at 0 Volts.

Figure 17:
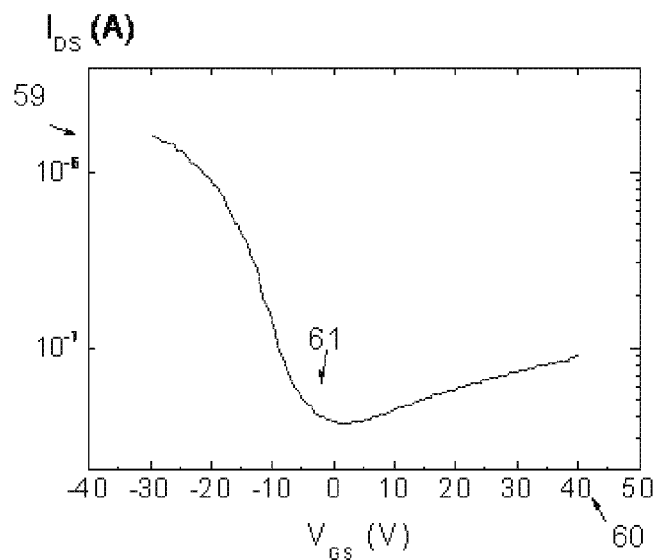

FIG. 17—Drain-source current transfer curve as a function of the gate-source voltage, for a fixed drain voltage of −15 Volts of the device depicted in FIG. 16, according to the numbering of the legend:
- 59—Representation of the drain-source current scale, wherein each major division corresponds to a decade with the origin at $10^{-10}$ A;
- 60—Representation of the gate-source voltage scale, wherein each major scale division corresponds to 10 Volts, with the origin at 0 V;
- 61—On/Off ratio of the transfer curve with upper value of $5 \times 10^2$, corresponding to a mobility larger than 1.8 $cm^2V^{-1} s^{-1}$.

Figure 18:
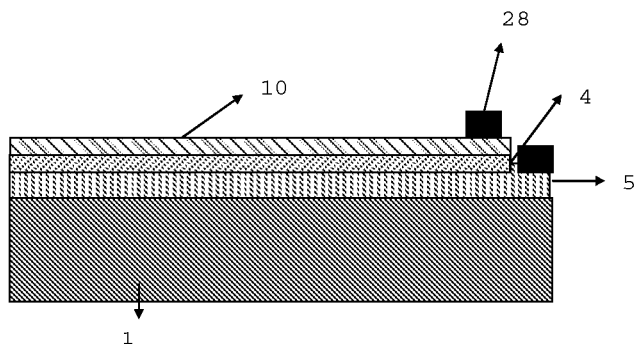

FIG. 18—Cross sectional view of a p-n junction based on an n-type oxide, such as GZO, GZSO, or AZTO (12), and a p-type oxide (11), such as non-stoichiometric copper monoxide $(OCu_2)_x$ with embedded metal copper species (Cu) $[(OCu_2)_x+(Cu_{1-2})_y$, wherein $0.05 \leq x < 1$ and $0.01 \leq y \leq 0.9$]; tin monoxide (OSn) with embedded metal (Sn) species $[(OSn)_z+(Sn_{1-2})_w$ wherein $0.05 \leq z < 1$ and $0.01 \leq w \leq 0.9$]; Cu—Sn alloy oxides with embedded metal Sn and Cu species

[(O—Cu—Sn)$_a$+(Cu$_\alpha$—Sn$_\beta$)$_b$ with 0<α<2 and 0<β<2, wherein 0.05≤a<1 and 0.01≤b≤0.9]; and nickel oxide (ONi) with embedded Ni and Sn species [(O—Ni)$_a$+(Ni$_\alpha$—Sn$_\beta$)$_b$ with 0<α<2 and 0<β<2, wherein 0.05≤a<1 and 0.01≤b≤0.9], according to the numbering of the previous legends.

Figure 19:
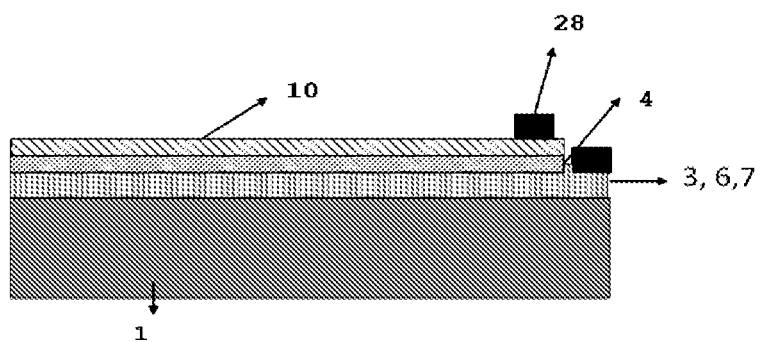

FIG. 19—Schematic representation of a non-encapsulated structure comprised by Metal, Insulator, and p-type semiconductor oxide, based on compounds of monoxides or tin, or copper or copper-tin or nickel, always with cation metal species in single form or as an alloy of the enumerated metals embedded in the structure, the so-called MIS diode, in which the electrical contacts are made using oxide materials with high conductivity or metal alloys or metals, such as the used and already previously described materials for the production of the gate, drain, and source electrodes and in which the insulator thickness varies between 5 nm and 2000 nm, according to the numbering of the previous legends.

Figure 20:
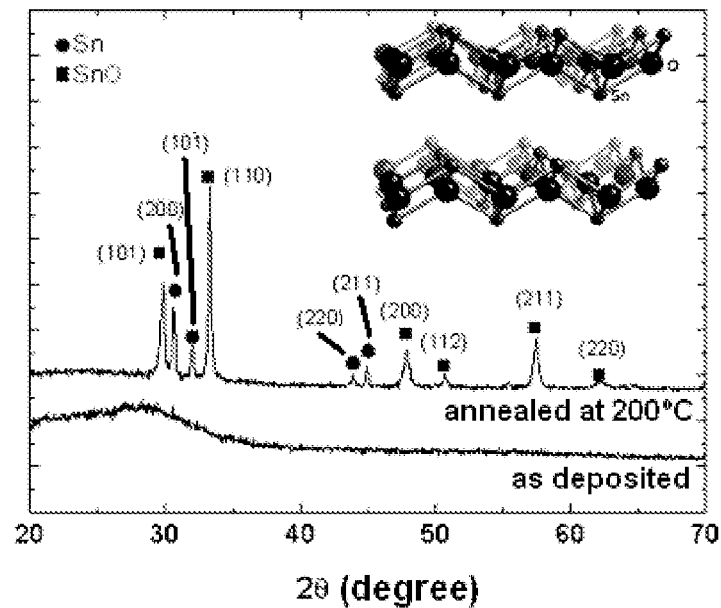

FIG. 20—X-ray diffraction patterns for a SnO film used at the channel layer, as-deposited and annealed at 250° C. in air atmosphere, with a thickness of 200 nm, deposited onto a glass substrate. The inset shows the crystal structure of tin (II) oxide[14] showing the layered structure of SnO and the wide-stretched open space between the Sn—O—Sn layers.

Figure 21:
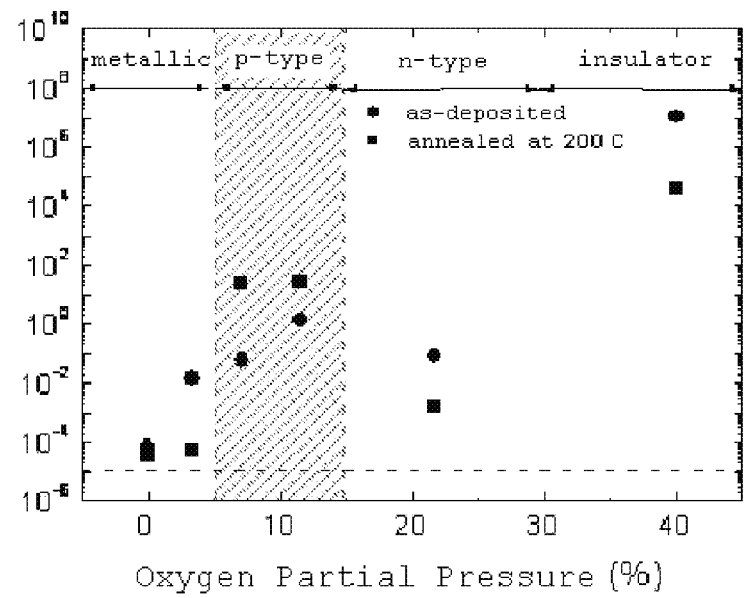

FIG. 21—Dependence of ρ measured by four-point probe on $O_{pp}$, for as-deposited and annealed SnO$_x$ films. The dashed line represents the ρ of metallic Sn with the value 1,2×10$^{-5}$ (Ωcm)$^{-1}$.

Figure 22:
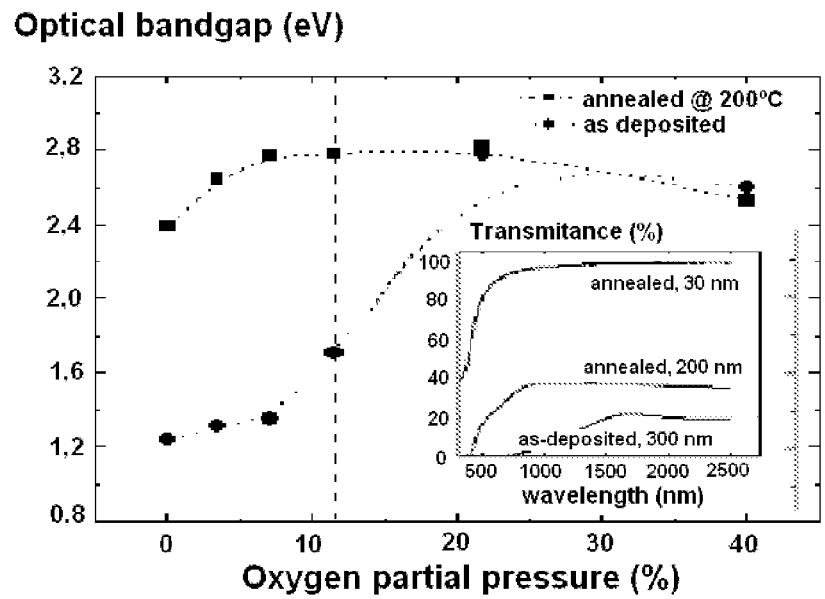

FIG. 22—Dependence of $E_{op}$ on $O_{pp}$ for as-deposited and annealed SnO$_x$ films. The inset shows the optical transmittance as a function of the wavelength for films produced with $O_{pp}$=11.5%, as well as a typical transmittance spectra for a film with the thickness used in the TFT (vertical black dashed line in the main plot).

Figure 23:
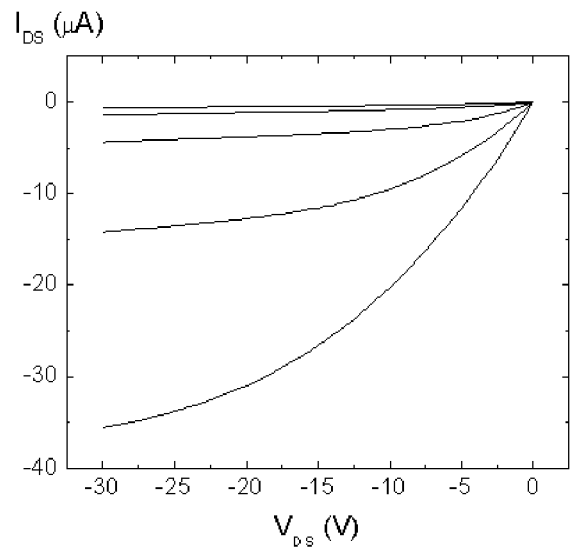
Figure 23:
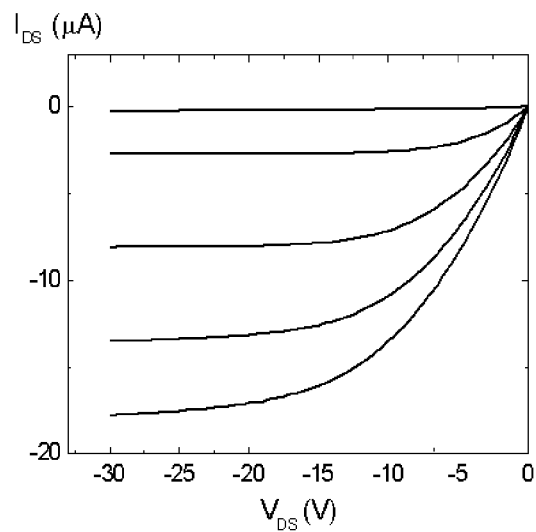
Figure 23:
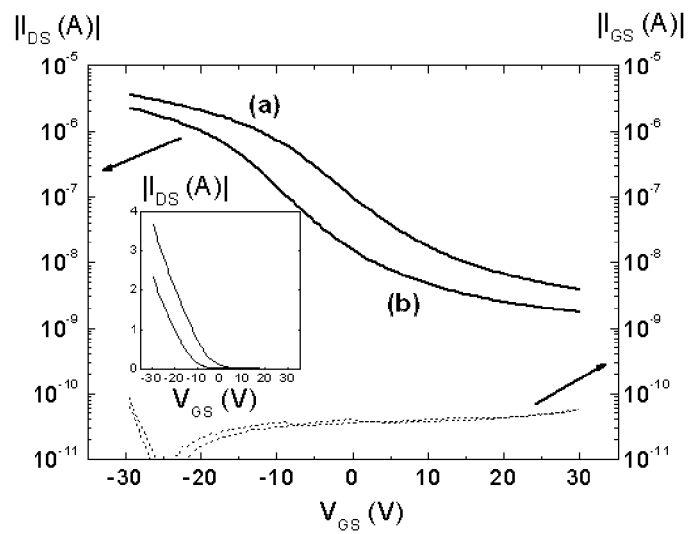
Figure 23:
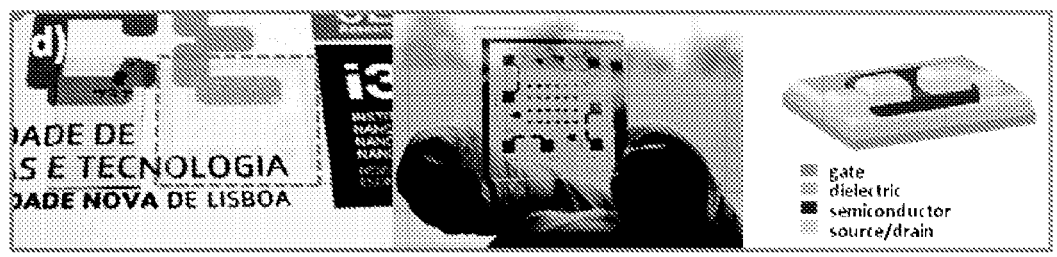

FIG. 23—Output characteristics ($I_{DS}$-$V_{DS}$) for p-type TFTs in enhancement mode operation, wherein SnO$_x$ is produced with a) $O_{pp}$=7.0 and Vg=−30 until 10V in 5 steps and b) $O_{pp}$=11.5% and Vg=−30 V until 10V in 5 steps; c) Transfer characteristics (|$I_{DS}$-$V_{GS}$|), left axis, and leakage current (|$I_{GS}$-$V_{GS}$|), right axis, for SnO$_x$ TFTs annealed under air at 250° C., wherein SnO$_x$ is produced with $O_{pp}$=7.0 and 11.5%. The inset shows the |$I_{DS}$-$V_{GS}$| plots, represented in linear scale, for $V_T$ extraction; d) Optical images of a SnO$_x$ thin film and some TFTs deposited onto glass substrates, as well as the type of TFT structure used.

Figure 24:
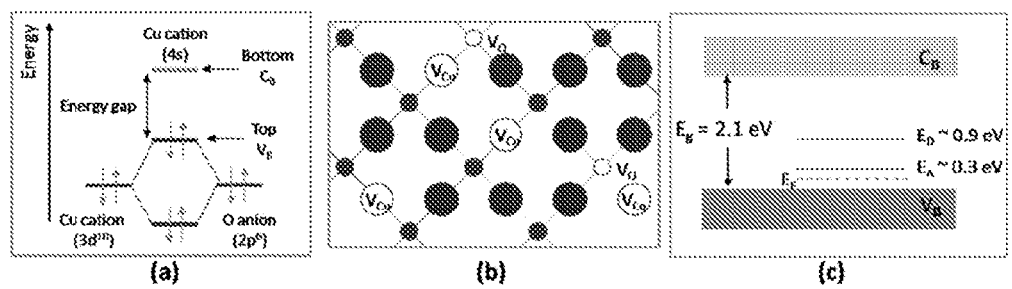

FIG. 24. (a) Chemical bond between an oxide ion and a cation that has a closed-shell electronic configuration; (b) pictorial representation of the more important defects in Cu$_2$O; (c) simple electronic model proposed by Brattain, with a compensated semiconductor with one acceptor level at 0.3 eV and a deep donor level at 0.9 eV from VB.

Figure 25:
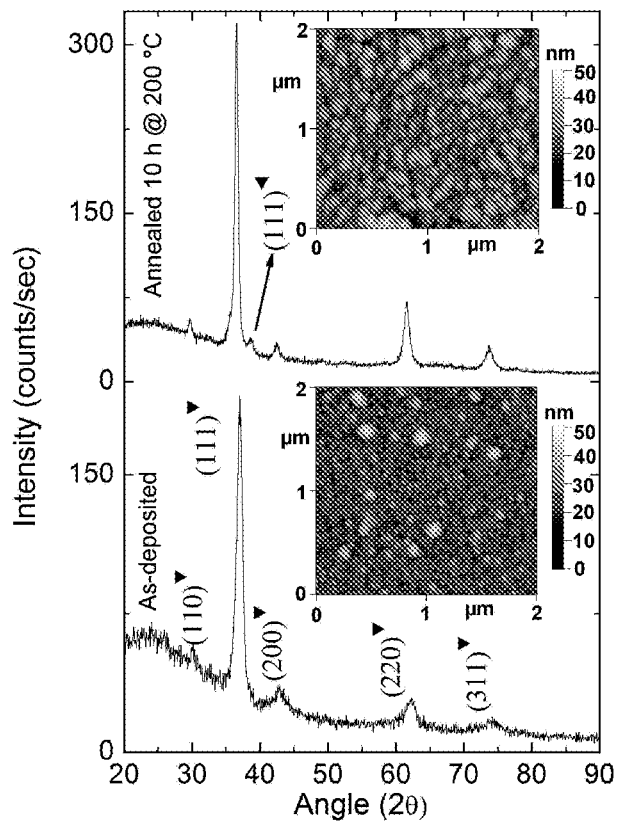

FIG. 25. (Color online) X-ray pattern of the Cu$_2$O film annealed at 200° C. under air for 10 hours in comparison with the as-deposited film. (Symbol representations: ▼—Cu$_2$O phase; ◄—CuO phase). The insets show the AFM images of the corresponding films.

Figure 26:
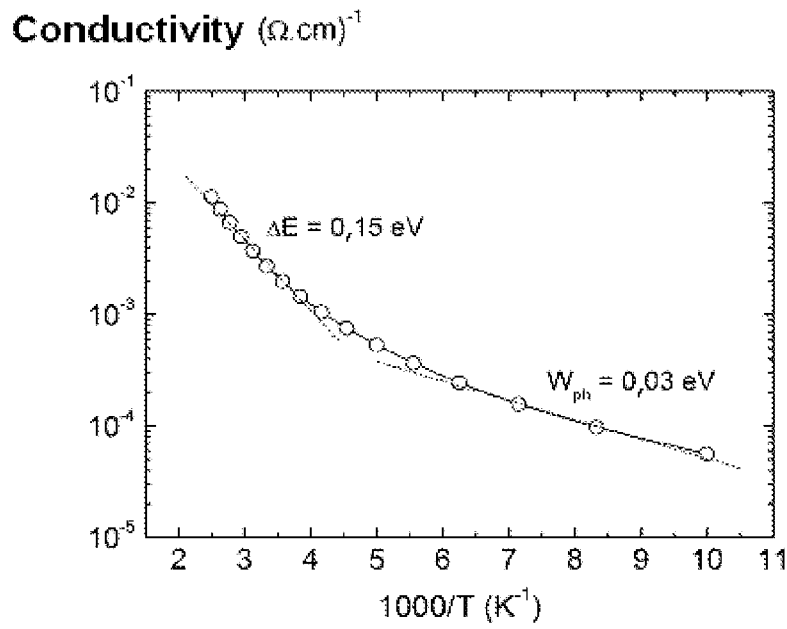

FIG. 26. Temperature dependence of dark conductivity for a Cu$_2$O thin film with 270 nm. The equation $$\sigma_t = \sigma_{0I} e^{-\frac{E_F - E_V}{k_B T}} + \sigma_{0H} e^{-\frac{W_{ph}}{2k_B T}} \quad (11)$$

represents the conduction mechanisms for these types of semiconductors. For higher temperatures, the conductivity is controlled by an acceptor center located 0.3 eV above the top of VB (VCu), while for low temperatures the conductivity is controlled by hopping.

Figure 27:
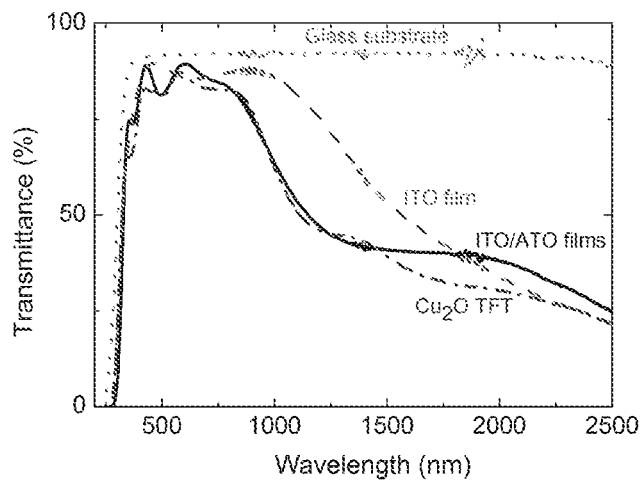

FIG. 27. Optical transmission spectra for the entire Cu$_2$O TFT structure including the glass substrate, being possible to observe that the Cu$_2$O TFT is fully transparent to visible light. For comparison purposes, the optical transmission spectra for the glass substrate, and the ITO and ITO/ATO films are also presented. The baseline was obtained under air, and the reference was also air, in order to quantify the total amount of transmitted light.

Figure 28:
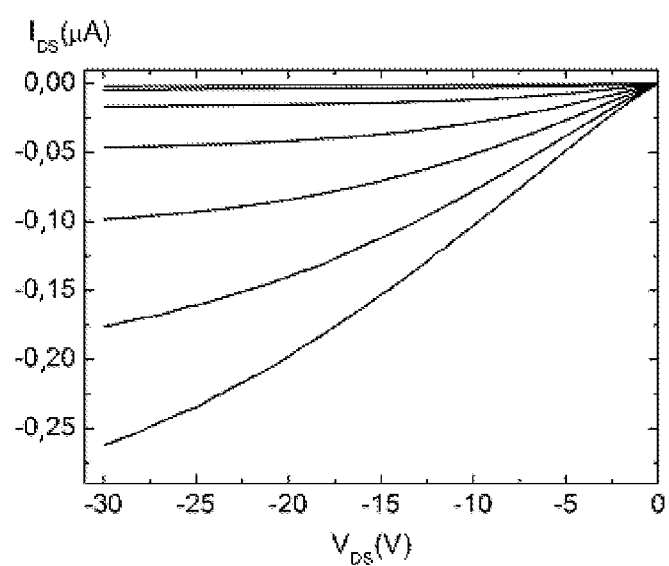
Figure 28:
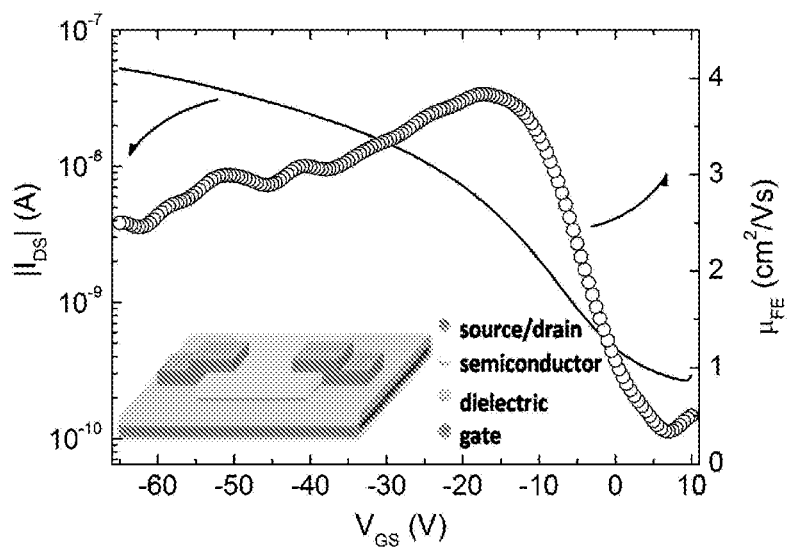

FIG. 28. (a) Output characteristics (IDS-VDS); (b) Transfer characteristics (|IDS-VGS|) at VD=−5 V (left axis) and μFE as a function of VGS (right axis between 5 and −55V in equal steps of −10V), for a typical Cu$_2$O TFT produced at room temperature and annealed in air at 200° C. The inset shows the structure of the bottom gate TFT.

Figure 29:
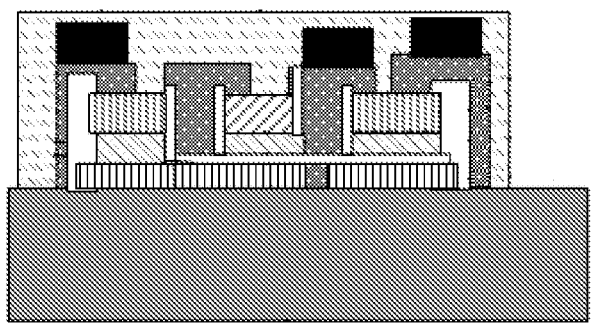

FIG. 29. Cross sectional view of an asymmetric CMOS device showing the channel, source, drain, dielectric regions, the matching layer from the dielectric to the channel material, the metal contacts, the surface encapsulation/passivation layer, resulting from the combination of a standard n-type TFT (like the ones based on GSZO or AZTO) in enhancement mode operation, and a p-type semiconductor oxide based on metal monoxide compounds of Cu, Sn, or Ni or multicomponent compounds thereof also in enhancement mode operation

DETAILED DESCRIPTION OF THE INVENTION

The present invention corresponds to the method and use of, as well as their combinations mentioned from a) to d) and whose process of production of oxides with metal characteristics, p-type semiconductor oxides, and insulators were also already exemplified. That is to say, the essential components thereof that allows the low temperature fabrication of the object of the present invention.

p-Type semiconductor oxides with metal characteristics, the so-called passive metal oxides, may be used in the fabrication of metal contacts, namely for contacts with p-type semiconductors.

p-Type semiconductor oxides may be used as active semiconductors in the production of the channel layer in electronic devices such as TFT, C-MOS, p-n and MIS junctions, ring oscillators, logical gates, logical addressing records, and light emitting diodes, among others.

These films may contain impurities in order to control their deficit in free charge transport electrons (free positive charges, referred to as holes) and thus the conductivity of the materials in a large range of values, from 10$^{-14}$ S·cm$^{-1}$ to 10$^5$ S·cm$^{-1}$. In terms of devices, it is expected:

To create and manufacture metal-insulator-semiconductor (MIS)-type diodes, in which the p-type semiconductor is one of the tin or copper or nickel monoxides, with the metal species thereof embedded in the structure, or one of the combinations of a single or composite metal monoxide incorporated with metal species, as described in a) to d), containing metal on one side and the p-type active semiconductor, as previously described, deposited onto the other side, using any of the previously mentioned technologies, whose examples are outlined in FIGS. 8-11 or others.

Figure 3:
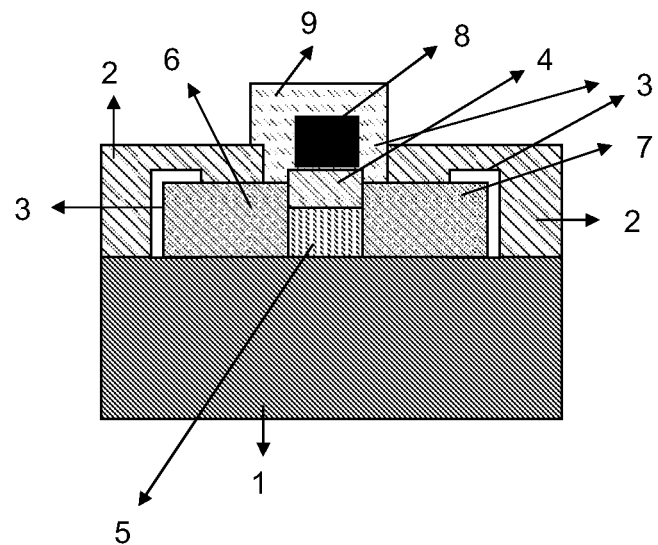
Figure 4:
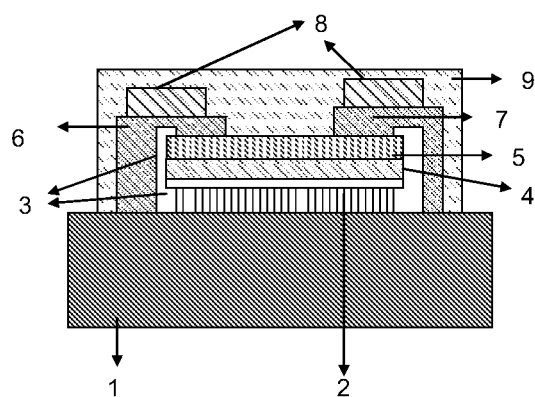
FIG. 4—Cross sectional view of a schematic representation showing a thin film transistor (TFT), with non-staggered symmetrical structure, showing the channel, source, drain, dielectric regions, and the matching layer from the dielectric to the channel material, the metal contacts, the surface encapsulation/passivation layer, according to the numbering of the legend of FIG. 1.
Figure 5:
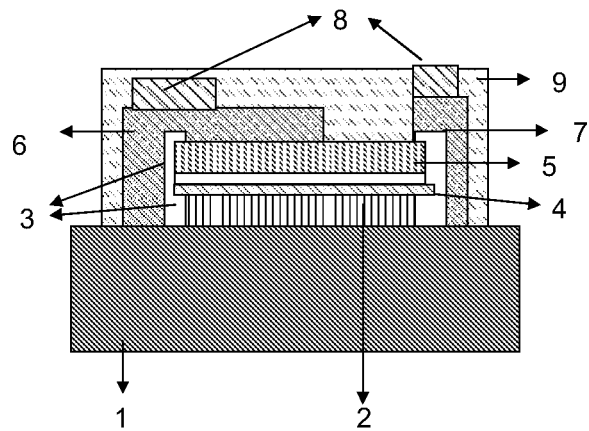
FIG. 5—Cross sectional view of a schematic representation showing a thin film transistor (TFT), with staggered asymmetrical structure, showing the channel region, source region located immediately above the channel region, with displaced drain, dielectric region, and the matching layer from the dielectric to the channel material, the metal contacts, the surface encapsulation/passivation layer, according to the numbering of the legend of FIG. 1.
Figure 6:
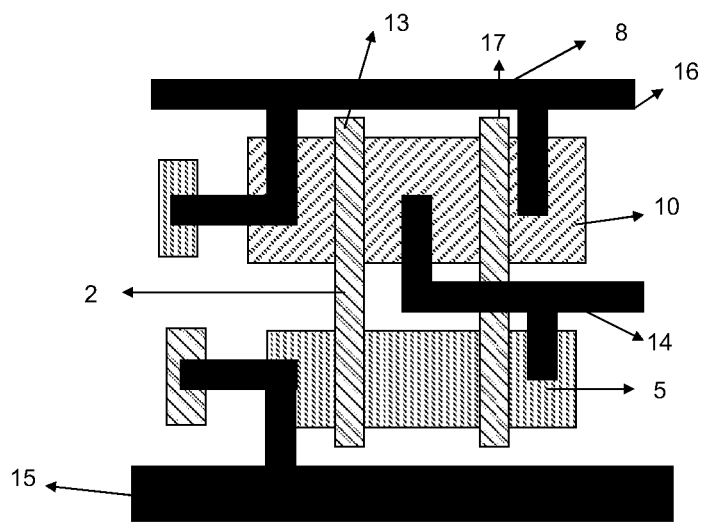
FIG. 6—Perspective view of a NAND logic gate, based on C-MOS structures as depicted in FIG. 1, according to the numbering of the legend of FIG. 1 and additionally:
17—Second input of the logic gate FIG. 7—Schematic representation of the electronic circuit of an oscillator circuit comprised by the association of three CMOS inverter circuits, as referred to in FIG. 1, according to the numbering of the previous legends and additionally:
18—Electronic symbol of the inverter circuit shown in FIGS. 1 and 2.
Figure 7:
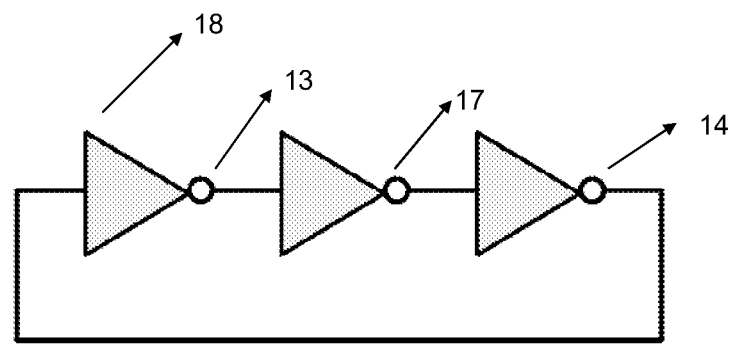

To create and manufacture p-type field effect transistors based on thin films (FIGS. 3 to 5) in which the active layer of the channel region is one or a combination of one of the single or composite metal monoxides incorporated with metal species, as described in a) to d), individually or grouped in multiple layers, (10) and wherein the Gate (2), Source (6), and Drain (7) regions are based, respectively, on a highly conductive oxide or on a metal or on a highly n or p-doped n-type covalent semiconductor, with the ability to act as a switching key and also to act as information conductors/receptors and amplifiers. These devices are built as shown in FIGS. 3 to 5, in which the channel (10) may have lengths that vary between 1 nm and 1,000 µm, being directly deposited onto the selected dielectric or onto an interface matching layer previously deposited over the dielectric layer (4). These devices have hole mobilities larger than 0.05 $cm^2V^{-1} s^{-1}$ when based on copper monoxide, or larger than 0.5 $cm^2V^{-1} s^{-1}$ when based on non-stoichiometric tin monoxide, or larger than 1.5 $cm^2V^{-1} s^{-1}$ when based on non-stoichiometric nickel-tin alloy oxides, with ON/OFF ratios larger than $10^3$, always independently from the selected type of substrate (rigid or flexible, such as paper) or dielectric layer (from the conventional inorganic and organic ones, such as paper), in enhancement mode operation at low voltages, or depletion mode, that is, they are connected without applying any voltage between the source and the drain as long as a voltage is applied to the gate electrode;

To create and manufacture p-type TFTs with commutating voltages below 0 V for the on state when in enhancement mode operation, or with positive voltages when in depletion mode operation;

To create and manufacture p-type TFTs exhibiting drain-source saturation currents above $10^{-7}$ A and leakage currents below $10^{-9}$ A.

Figure 1:
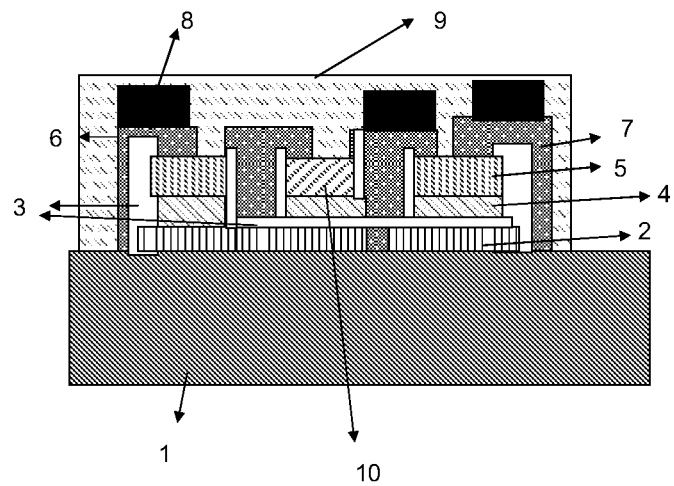
FIG. 1—Cross sectional view of an asymmetric CMOS device showing the channel, source, drain, dielectric regions, the matching layer from the dielectric to the channel material, the metal contacts, the surface encapsulation/passivation layer, resulting from the combination of a standard n-type TFT (like the ones based on GSZO or AZTO) in enhancement mode operation, and a p-type semiconductor oxide based on metal monoxide compounds of Cu, Sn, or Ni or multicomponent compounds thereof also in enhancement mode operation, according to the legend:
1—Substrate
2—Gate electrode (highly conductive metal or oxide, such as IZO, GZO, AZO).
3—Dielectric (for example, silicon dioxide, alumina, hafnia, silicon nitride).
4—Dielectric-channel matching layer, comprised by Ta$_x$O$_y$ or similar.
5—n-Type channel (such as GSZO or AZTO).
6—Source (Metal or IZO or ZGO or AZO with high conductivity)
7—Drain/source (using materials similar to 6).
8—External metal contact
9—Surface encapsulation, passivation layer, comprised by polymer such as SU8 or by MgF$_x$ or silicon nitride.
10—Channel of the p-type transistor, according to the present invention, comprised by: (SnO)$_z$—Sn$_w$, wherein $0.05 \leq z < 1$ and $0.01 \leq w \leq 0.9$; or (OCu$_2$)$_x$—(Cu$_{1-2}$)$_y$, wherein $0.05 \leq x < 1$ and $0.01 \leq y \leq 0.9$; or (O—Cu—Sn)$_a$+(Cu$_\alpha$—Sn$_\beta$)$_b$ with $0 < \alpha < 2$ and $0 < \beta < 2$, wherein $0.05 \leq a < 1$ and $0.01 \leq b \leq 0.9$; or (O—Ni)$_a$+(Ni$_\alpha$—Sn$_\beta$)$_b$ with $0 < \alpha < 2$ and $0 < \beta < 2$, wherein $0.05 \leq a < 1$ and $0.01 \leq b \leq 0.9$].
Figure 2:
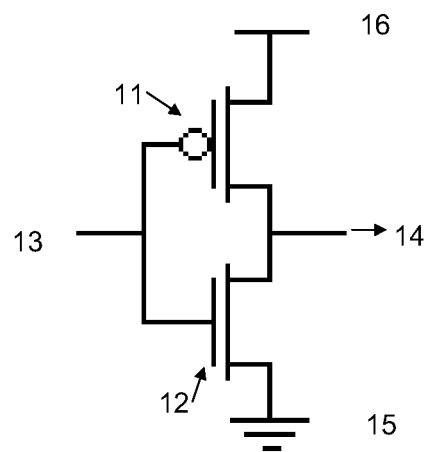
FIG. 2—Schematic representation of the electronic circuit of the device depicted in FIG. 1, showing the two p and n-type transistors, according to the following legend:
11—p-Type channel transistor
12—n-Type channel transistor
13—Point of input voltage
14—Point of output voltage
15—Reference voltage or ground
16—Point of bias voltage FIG. 3—Cross sectional view of a schematic representation showing a thin film transistor (TFT), with staggered symmetrical structure, showing the channel, source, drain, dielectric regions, and the matching layer from the dielectric to the channel material, the metal contacts, the surface encapsulation/passivation layer, according to the numbering of the legend of FIG. 1.

To create and manufacture CMOS or C-MESFET devices in which the p-type semiconductor is one of or the combination of one of the single or composite metal monoxides incorporated with metal species, as described in a) to d), individually or grouped in multiple layers (10), and the n-type semiconductor (5) may be an inorganic covalent semiconductor, such as n-doped silicon, or ionic inorganic semiconductors, such as GTZO or AZTO, or organic semiconductors, or any of their possible hybrid combinations, as shown in FIG. 1. That is to say, a device based on p and n-type transistors, with a common gate, wherein one of the output terminals (source or drain, or vice versa) is common and the other two output terminals are independent from each other.

To create and manufacture p-type oxides based on one or a combination of one of the single or composite metal monoxides incorporated with metal species, as described in a) to d), individually or grouped in multiple layers of high electrical conductivity (above $10^3$ $Scm^{-1}$) to be used as ohmic contact in electronic or optoelectronic devices, namely in the contact with organic and inorganic p-type semiconductors.

The above mentioned electronic devices, such as C-MOS, TFT, or PN-type heterojunctions based on these p-type semiconductor oxides, present the following advantages in comparison with the conventional ones:

The fabrication process of the pn junctions-based transistor or devices takes place at room temperature or at temperatures preferably lower than 250° C.;

To manufacture and create oxides using the existing technology, already matured, as done in the sputtering technique, which has been used to manufacture large area electronic devices, but that now will be used to produce the materials of the present invention, at low substrate temperatures;

To ensure an identical or higher performance comparing to the currently used devices in the fabrication of devices, such as p-type organic or p-type amorphous covalent inorganic TFTs, like amorphous silicon, which are highly stable;

Once manufactured, the devices can then be annealed under controlled atmosphere, at temperatures preferably below 300° C., mainly to improve the contact ohmicity in semiconductors;

In the case of heterojunctions, the transparent oxide semiconductor can be used simultaneously as an ohmic contact and the active element of the junction, thereby avoiding the need to use an extra step in the fabrication process, such as an extra layer to be used as the transparent contact;

To manufacture highly stable and reproducible devices;

To manufacture fully transparent or semi-transparent devices and logic circuits, including devices and integrated systems based on C-MOS technology.

The fabrication process of the films mentioned above and described from a) to d) can be achieved through chemical, physical, or physical-chemical deposition techniques, such as resistive or electron gun thermal evaporation (see FIGS. 8 and 9); dc or rf sputtering, assisted or not by a magnetic field (see FIG. 10); or by ink-jet printing (see FIG. 11), with or without the presence of UV light to assist the deposition process.

The above mentioned techniques are also used to manufacture other materials and structures, such as to manufacture the metal contacts and dielectrics in unipolar or bipolar transistors, or to manufacture p-type oxides intended for applications as ohmic electrodes.

These tools are necessary to fabricate the materials and devices claimed in the present invention, such as TFT, or heterojunctions or logic gates or C-MOS or inverter circuits, or ring oscillators or conductive oxides.

The temperatures of the fabrication process used to manufacture the materials and devices claimed in the present invention vary preferably between 20° C. and 250° C., depending on the functions of the desired device and on the type of substrate being used.

In order to take out the electric signal from the manufactured devices, using the above described p-type oxides, one may use metal contacts based on high conductivity metals, such as Cr or Ag, or Ti, or Au or Al, in single or combined forms, or a highly conductive degenerated semiconductor oxide, such as gallium-doped zinc oxide, ZGO, or zinc and indium oxide, IZO, also including high conductivity p-type organic semiconductors, either using or not highly conductive p-type oxide as intermediate layer.

The devices based on the previously described non-stoichiometric oxides, when used in the manufacture of TFT-type devices, may have a thickness that varies between 1 nm and 1000 nm, and may be provided with an encapsulation layer and a matching layer for the materials to which these p-type oxides will be connected, such as, e.g. silicon dioxide or silicon nitride or tantalum pentoxide, or polymeric films, such as SU8, with thickness varying between 1 nm and 1000 nm; they either may or not be annealed at temperatures up to 300° C., using annealing times between 20 minutes and ten hours, as a function of the type of substrate being used and the type of device to be manufactured.

For the manufacture of p-n-type heterojunctions, where p-type and n-type oxides are used for the fabrication of the above mentioned devices, the thicker oxide corresponds to the semiconductor with lower number of free carriers (electrons or holes), as is the case when the TFT channel region is produced using p-type oxides, while the thinner oxide should possess a thickness at least one order of magnitude, 10 times, lower than the previous one, and possess free carriers at least one to two orders of magnitude, 10 to 100 times, larger than the thicker oxide, such as, e.g. n-type oxides used in the manufacture of electrical contacts with high or very high conductivity and referred to as passive semiconductor oxides.

1. Method for the Preparation of the Materials a) non-stoichiometric tin monoxide with metal tin embedded in its structure $[(OSn)_z+(Sn_{1-2})_w]$ where $0.05 \leq z < 1$ and $0.01 \leq w \leq 0.9$].

For the specific case of non-stoichiometric tin oxide, the transport properties of those oxides may vary strongly, with the deviation ($\Delta x$) depending on the existing native disorder and on the nature and concentrations of involved atoms and defects. As already mentioned in A, $$\Delta x = \frac{[\overline{O}_i] + [\overline{O}_{Sn}] + [\overline{V}_{Sn}] - [\overline{Sn}_i] - [\overline{Sn}_O] - [\overline{V}_O]}{N_0} \quad (5)$$

wherein $[V_{sn}]$ ($\overline{V}_{Sn}=[V_{Sn}^x]+[V_{Sn}^-]+[V_{Sn}^{2-}]+[V_{Sn}^{3-}]$) and $[V_O]$ ($\overline{V}_O=[V_O^x]+[V_O^+]+[V_O^{2+}]$) are the total average concentration of vacancies in oxygen and tin sub-lattices, respectively; $N_0$ is the number of available places of each (oxygen and tin) sub-lattice per cubic centimeter, the following being true:

I. In order to retain the metal character, the $Sn_\beta$ concentration in the structure should preferably exceed the $SnO_{\alpha x}$ aggregates. That is, the metal character is maintained whenever, during the fabrication process, there are no oxidizing species (percentage of oxygen partial pressure $P_{pO}$ zero in the argon admixture) or whenever preferably $P_{pO}<5\%$.

II. In order to achieve p-type semiconductor character it is important that any of the previously described conditions are fulfilled. That is to say, the matrix lattice of the oxides presents $Sn_{\beta x}$ species, with $x>0$ and $x<1$, and $SnO_{\alpha x}$ species, wherein $x>1$ and $x<2$. That is, tin monoxide-type species are out of stoichiometry. For instance, that can be achieved if preferably $5\%<P_{pO}<15\%$ and $Sn_{\beta x}<0.25$. Outside this window, the $SnO_{\alpha x}$ species are no longer dominant and the p-type semiconductor character is no longer observable, with the semiconductor presenting an n-type character. This part of the study is embodied in the appended article draft. This very same window shifts to the right (for example, $15\%<P_{pO}<25\%$) in equal intervals with increasing $Sn_{\beta x}$ (e.g. for values below 0.7). In the latter case, the transparency of the semiconductor is drastically reduced with increasing number of $Sn_\beta$ species.

III. For the oxide to have insulating characteristics, the condition to be fulfilled is preferably that species of $Sn_{\beta x}<0.05$ and that there is an excess of incorporated oxygen species, balancing the highest possible number of vacancies and voids left by tin atoms in the Sn sub-lattice. That can be achieved whenever preferably $P_{pO}>42\%$.

b) non-stoichiometric copper monoxide with metal copper embedded in its structure $[(OCu_2)_x+(Cu_{1-2})_y]$, where $0.05 \leq x < 1$ and $0.01 \leq y \leq 0.9$].

The way semiconductor oxides can be obtained mainly controlled by copper metal species is similar to the previous one, but now the admixtures will be based on metal copper in the cubic tetragonal form ($Cu_{cx}$), wherein $x>1$ and $x<2$, and the oxide species will be of the $Cu_{cx}O_{1-x}$ type, which in the limit tends to the cubic stoichiometric form $(Cu_2O)_{cx}$.

I. p-Type semiconductor oxides: The monoclinic $(CuO)_{mx}$ form does not result in the formation of the desired species that lead to the formation of the band of localized states above the valence band, required for a p-type semiconductor oxide, at least for temperatures below 400° C. In this specific case, the process window widens: preferably $5\%<P_{pO}<55\%$ and $Cu_{cx}>1.25$ (representing a percentage of incorporation in the final composition of the admixture, preferably lower than 35% and in which the monolithic copper oxide species are preferably lower than the copper oxide in cubic form preferably at least by a factor of 1.5).

II. Oxides with metal characteristics at low temperatures are obtained whenever preferably $Cu_{cx}<1$ (representing a percentage of incorporation in the final composition of the admixture, preferably above 35%) and preferably $P_{pO}<5\%$.

III. Copper oxide insulating material is obtained, in monolithic or cubic form, whenever the oxide incorporation percentage is preferably higher than 80% and the single metal species incorporated in the admixture are preferably lower than 10%. That is to say, the window for obtaining these oxides as electrical insulating materials is much narrower.

c) non-stoichiometric copper-tin alloy monoxide with copper-tin alloy metal species embedded in its structure $[(O—Cu—Sn)_a+(Cu_\alpha—Sn_\beta)_b]$ with $0<\alpha<2$ and $0<\beta<2$, where $0.05 \leq a < 1$ and $0.01 \leq b \leq 0.9$].

This case comprises the combination of the two previous cases, with the advantage of achieving a wider process window for transparent conductor oxides and with higher conductivities. On the other hand, for the case of fabrication of p-type semiconductor oxides, the window is by far wider than the case of non-stoichiometric tin oxides, being controlled into the one described for the case of non-stoichiometric copper monoxides, however loosing in the transparency degree of the obtained films. In terms of insulating materials, the process window is smaller.

d) non-stoichiometric nickel oxide with nickel and tin alloy metal species embedded in its structure $[(O—Ni)_a+(Ni_\alpha—Sn_\beta)_b]$ with $0<\alpha<2$ and $0<\beta<2$, wherein $0.05 \leq a < 1$ and $0.01 \leq b \leq 0.9$].

The properties and way of obtaining oxides with metal, p-type semiconductor, and insulating characteristics follow the same principles enumerated for tin, but with much wider windows:

I. In order to retain the metal character, the Ni concentration in the structure should preferably exceed the $NiO_x$ aggregates. That is, the metal character is maintained whenever, during the fabrication process, there are no oxidizing species (percentage of oxygen partial pressure $P_{pO}$ preferably zero in the argon admixture) or whenever preferably $P_{pO}<3\%$.

II. In order to achieve a p-type semiconductor character it is important that any of the previously described conditions are fulfilled. That is to say, the matrix lattice of the oxides presents $Ni_x$ species, with $x>0$ and $x<1$, and $NiO_x$ species, wherein $0<x<1$. That is, nickel monoxide-type species are out of stoichiometry. For instance, that can be achieved if preferably $5\%<P_{pO}<45\%$ and $Ni_x<0.20$. Outside this window, the $NiO_x$ species leading to the p-type character of the oxide are no longer dominant and the semiconductor is no longer p-type, with the semiconductor presenting an n-type character or p-type extrinsic metal contact.

III. This very same window moves to the right (for example $15\%<P_{pO}<75\%$) in equal intervals with increasing $Ni_x$ (e.g. for values below 0.75). In the latter case, the transparency of the semiconductor is drastically reduced with increasing number of ni species.

For the oxide to have insulating characteristics, the condition to be fulfilled is preferably that species of $Ni_x<0.05$ and that there is an excess of incorporated oxygen species, balancing the highest possible number of vacancies and voids left by tin atoms in the Sn sub-lattice. That can be achieved whenever preferably $P_{pO}>70\%$.

As said, for the fabrication of films based on the above described monoxide combination types one should first select the desired ratios of y:x; w:z; a:b, with $0<\alpha<2$ and $0<\beta<2$, for the intended compositions, as a function of the intended application, such as p-type oxide, using temperatures preferably from room temperature up to 250° C., either with or without thermal treatment, preferably up to temperatures around 300° C.

After the desired composition and the impurities to be added are selected, one selects the way the materials will be deposited and, if it is wanted to grow films using just one source or several sources containing the materials to be deposited, using vacuum deposition systems and an inert or reactive atmosphere; using basic, neutral, or acid aqueous solutions, either with or without the presence of UV light to assist the process of growing the films.

As far as the deposition process is concerned, one can select physical (PVD), physical-chemical (CVD), or chemical deposition techniques, using a load lock chamber for loading the deposition chamber with the substrates. If a PVD technique is selected, a reference pressure preferably as low as $10^{-7}$ Pa is used, with a distance between the substrate and the source, containing the material to be deposited, which is a function of substrate size and technique to be used. For instance, if the selected PVD technique is sputtering or evaporation, for substrates with sizes of 10 cm×10 cm, the distances may vary between 2 centimeters and 50 centimeters, and can be as high as 150 cm for substrates with dimensions of 1 m×1 m.

For instance, if the deposition technique is resistive or electron gun thermal evaporation with a reference atmosphere as low as $10^{-7}$ Pa (see FIGS. 8 and 9), one can use one or multiple evaporation sources multi-distributed along the plan opposite to the face of the film/coating substrate where the deposition will occur, which is statically located (23) in the deposition chamber or moves continuously (roll to roll process), as a function of the growth rate desired.

Figure 8:
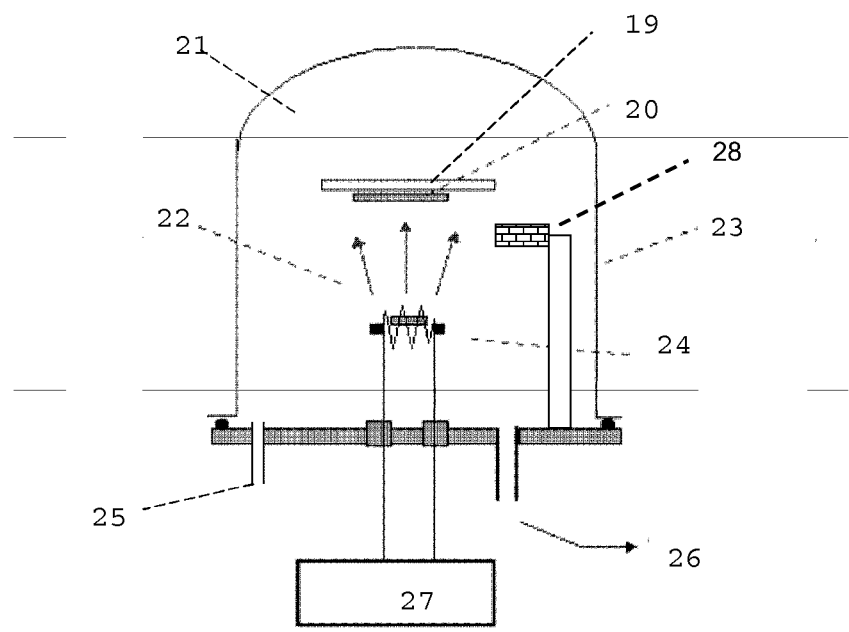
FIG. 8—Schematic representation of a film production system by resistive thermal evaporation, showing details of the chamber, according to the legend of figure:
19—Substrate or target holder
20—Substrate onto which the device is to be deposited
21—Inside view of the chamber in depression mode of about $10^{-3}$-$10^{-7}$ Pa, either containing or not an inert gas, such as Argon.
22—Flow of the evaporating material.
23—Process Chamber.
24—Heating Resistance Element/Boat containing the material to be evaporated.
25—Gas inlet (oxygen, argon, hydrogen, nitrogen, . . . ) into the chamber
26—Chamber disposal system outlet.
27—Power supply (energy, W) of the boat containing the material to be evaporated
28—Ultraviolet light source FIG. 9—Schematic representation of an electron gun thermal evaporation source, showing the details of the electron gun, according to the previous legend and the one of the figure:
29—Boat containing the material to be evaporated;
30—Focus of the electron beam;
31—Electron gun (source of electron production);
32—Water cooling system for the boat/oven.
Figure 9:
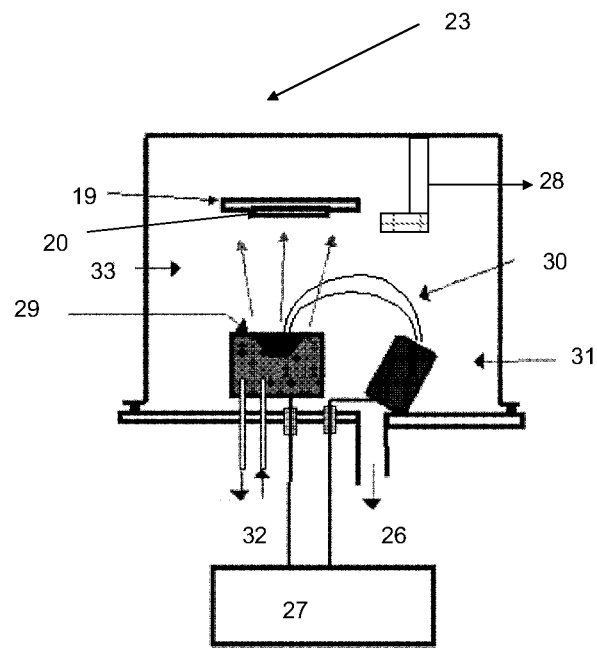

If the deposition sources are metallic, as already mentioned, the elements to be deposited can take the form of one or more alloys, according to the compositions selected from the above mentioned compositions from a) to d), comprised by, for example, one evaporation source containing the base metal of the structure, alternately distributed with another source containing the desired impurities, and wherein the process atmosphere should be oxidizing, that is, oxygen must be introduced into the process chamber, see FIG. 8, (25), in order to achieve an oxygen partial pressure between $10^{-2}$ Pa and $10^{-5}$ Pa, see FIG. 8, (22), in which the deposition pressure is controlled by controlling the filament current used, see FIGS. 8 and 9, (27). If the thermal evaporation process is resistive, one uses a low power voltage (below 50 V) and high current (up to 500 A) source, and wherein the total energy supplied to the process is a function of the intended growth rate (from 0.01 $nm^{-1}$ to 20 $nm^{-1}$), as a function of the substrate size used and of the distance between the evaporation source and the substrate and of the number of evaporation sources used.

In case the starting materials used in the thermal evaporation are in ceramic form, that is, already in the oxide form, the constituent materials can already be in the form of one or more ceramic compounds, acting as an evaporation source that will be alternately distributed with a source containing the impurity(impurities) to be introduced in the final film/coating, in another ceramic compound, wherein the process atmosphere may either be oxidizing or not, that is, introducing oxygen into the chamber in order to achieve an oxygen partial pressure that may vary between $10^{-2}$ Pa and $10^{-7}$ Pa, and wherein the deposition process is conducted by controlling the filament current used in the process, which in the resistive case involves a low power voltage (up to 50 V) and high current (up to 500 A) source, and in the electron gun case (see FIG. 9), the filament current can be as high as 7 A, as a function of the substrate size to be used and thus of the distance between the evaporation source and substrate, and of the number of evaporation sources being used, as well as the intended growth ratio, that may vary between 0.01 nms-1 and 20 nms-1.

In case the starting materials used in the thermal evaporation are in ceramic form, that is, already in the oxide form, the constituent materials can already be in the form of one or more ceramic compounds, for example, compound containing the desired composition Cu or Sn or Ni or alloys, acting as an evaporation source that will be alternately distributed with a source containing the impurity(impurities) to be introduced in the final film/coating, in another ceramic compound, wherein the process atmosphere may either be oxidizing or not, that is, introducing oxygen into the chamber in order to achieve an oxygen partial pressure, besides the inert gas, such as, for example argon, that may vary between $10^{-2}$ Pa and $10^{-7}$ Pa, for a total pressure of the process that may vary between $10^{-1}$ Pa and $10^{-4}$ Pa.

Whatever the manufacture process selected for the fabrication of the oxides of the types listed from a) to d), one can use zirconium impurities in metal or ceramic form, either including or not the alloy compositions containing the main composition to be deposited directly or by co-deposition, that is, using more than one source, wherein the percentages x, y, or w, z, or a, b for the different $\alpha$ and $\beta$ are preferably previously selected from the range between 0.9995 and 0.80 of the amount of the selected impurity.

Besides thermal evaporation, one may use the continuous current or rf sputtering technique, with or without the presence of a magnetron to confine the deposition process, and wherein the targets to be used can be metal targets, see references (34), (35), (37), and (38) of FIG. 10, containing the desired composition, under an oxidizing atmosphere or using ceramic evaporation sources, wherein growth ratios may vary between 0.01 $nms^{-1}$ and 20 $nms^{-1}$, as a function of the power energy used during the deposition process (dc or rf power that may vary between 0.01 $Wcm^{-2}$ and 20 $Wcm^{-2}$); partial pressures of the inert gases (Argon, Helium, or Xenon) and reactive atmospheres (oxygen and or hydrogen and or fluorine) to be used, that may vary between $5\times10^{-2}$ Pa and $10^{-5}$ Pa, for a total deposition pressure that may vary between $5\times10$ Pa and $10^{-4}$ Pa; the substrate bias used; distance substrate-target used; substrate size; number of targets used; using temperatures below 250° C., as indicated in FIG. 10 (25 and 35), (27), (37 and 38), (33 and 36), using rigid or flexible substrates, such as glass, silicon, polymer, mylar or cellulosic paper.

Besides the two techniques described above, the set of films described above of the items a) to d) may be manufactured by other physical, physical-chemical techniques and chemical methods, such as thermal evaporation by pulsed laser; atomic or molecular layer epitaxial growth, or sol-gel or spray atomized pyrolysis, or electrodeposition, or by ink-jet printing, see FIG. 11, or by spin coating, wherein all these techniques should be used with or without the presence of UV light; either with or without the presence of an oxidizing atmosphere, such as oxygen, or a non-reactive atmosphere, such as argon, helium, or xenon, or a reactive atmosphere, such as hydrogen or fluorine or nitrogen, in their acidic or basic gas forms.

If the selected deposition method is by ink-jet printing, the elements to be deposited are in the form of a basic, neutral, or acid solution of chemical compound, or in the form of suspensions of inorganic nanoparticles, containing copper or tin, nickel, or alloy of two or three of the mentioned metals, with sizes below 50 nm, diluted in an aqueous solution that may contain an alcohol (ethyl or methyl alcohol, propanol), another stabilizing element for the solution, the deposition being performed by atomized spraying of the heated or non-heated (up to 400° C.) solution or suspension over substrates that may be heated at temperatures preferably up to 250° C., as a function of the selected solvent and substrate, see FIG. 11, (19), (20), (40), (41) and (43).

Whatever the chemical deposition method selected, the films to be deposited are based on unique solutions or suspensions containing the elements to be deposited, including the impurities, at growth rates that may vary between 0.01 $nms^{-1}$ and 10 $nms^{-1}$, in which the dissociation rate of the species is a function of the dimensions of the nanodrops, of the injector, and of the atomizer used.

Whatever the chemical deposition method selected, the films have thicknesses preferably comprised between 1 nm and 1000 nm, as a function of the envisaged application, such as passive or active semiconductors in nanoelectronics, microelectronics, using insulating substrates, such as glass, polymer, or cellulosic paper substrates, or passivated conductive substrates with insulator, such as stainless steel or metal molybdenum, or passivated semiconductor substrates, such as crystalline or polycrystalline silicon substrates, or using other oxides as substrates, p- or n-type, as a function of the envisaged application.

Whatever the film deposition method selected, these can be processed using a static (substrate stopped during the deposition process) or dynamic (the substrate is moving during the deposition process) procedure, in order to allow the deposition of a homogeneous and uniform coating over the entire area of the substrate, whether the film structure is amorphous, nanocrystalline, or polycrystalline.

Once the films are deposited, with the desired thicknesses, onto the previously selected substrates, in the form of single and unique or multiple layers of a desired device, these may be annealed at temperatures that preferably vary between 50° C. and 300° C., using annealing times that may vary between 20 minutes and 12 hours, under a controlled atmosphere that may contain oxygen, or nitrogen, or a mixture of hydrogen and nitrogen, or nitrogen and fluorine, or nitrogen and oxygen, in proportions that may vary between 0.1:99.9 and 0.1: 0.1:9.8 of the gas composition mentioned above and performed at atmospheric pressure or under vacuum ($10^{-2}$ Pa to 1000 Pa). As an example, for the specific case of fabrication of p-type semiconductor oxides for the TFT channel region based on mixtures of non-stoichiometric tin monoxide alpha and metal tin beta, the percentage of oxygen in the argon admixture should be preferably comprised between 5% and 12%.

The electrical, electronic, and optical properties of the produced films depend on the composition and deposition conditions selected, including the annealing process, which will determine the nature of free hole concentrations, bulk and surface defects and thus the electrical conductivity, free carrier mobility, compactness degree of films, dielectric constant, optical absorption coefficient, and reflectivity of the materials. That is performed according to the process of controlling the species incorporated in the mixtures of oxides with metal species, according to what was previously described from A to C, presented as implementation examples of this invention. Therein it is explicitly stated that oxidizing and metal species lead to the innovative materials that are object of this patent, as well as the particular process conditions that lead to the materials with such distinct electrical properties as the ones referred to in the following.

Those properties may vary by altering the film composition or the oxygen partial pressure during the deposition process, or the oxidizing or reactive atmosphere during the thermal annealing, thereby allowing a controlled variation of the conductivity of these films between $10^{-14}$ S·cm$^{-1}$ and $10^5$ S·cm$^{-1}$ for films with thicknesses that may vary between 1 nm and 100.000 nm (low thicknesses for active devices or device structures wherein the thinner side refers to the side of the junction with higher concentration of free carriers, as already previously mentioned; large thicknesses preferably for applications such as conductive oxides or side of the semi-conductive junction with lower concentration of free carriers), presenting an amorphous, or nanocrystalline, or polycrystalline structure, highly compact and with low surface roughness, to be applied in electronic and optoelectronic devices as passive material, such as highly conductive ohmic contacts, with or without associated transparency, or as a dielectric material with high electrical resistivity, or to obtain blocking layers or matching layers in electronic and optoelectronic devices, namely in heterojunctions, that is, the union of two materials with different electronic affinities which require an extra thin layer to adapt to each other, or as an active electronic material to be used in the manufacture of pn heterojunctions, unipolar transistors, such as TFT or C-MOS and other devices, using any type of substrate, such as glass, polymers, metal or cellulosic paper.

2. Methods for the Preparation of Devices

The present invention refers to the use of a set of materials, whose preparation method was described above, leading to the creation of single or integrated electronic and optoelectronic devices and tailoring of the deposition processes, rendering it compatible with the manufacture of these new devices that should be chosen and controlled in order not to damage the surface of the substrate being used, such as glass, passivated metal foils, either with or without dielectric coating, silicon, polymers, mylar, cellulosic paper. For that purpose, all the fabrication processes are preferably performed at temperatures below 250 Celsius degrees, especially for those occurring in the surface of paper or Mylar as substrates.

The present invention is amenable to different configurations, depending on the desired specific application. The invention makes it possible to use the set of the above described p-type oxides in different types of electronic circuits, resulting in the creation of new electronic devices whose functionality is distinct from the conventional ones, namely field effect electronic devices.

The present invention thereby corresponds to the creation of a new device presenting a set of innovative characteristics, using innovative processes that allow the fabrication of new products and systems involving active or passive p-type semiconductor oxides, with the double function of ohmic contact and active component of electronic devices or integrated circuits.

A. Processing Field Effect p-Type Transistors

This section describes the processing method of encapsulated or non-encapsulated p-type field effect transistors, either with or without matching layer in the interfaces, as shown in FIGS. 3 to 5, in enhancement mode or depletion mode operation, that is, it can either be required or not to apply a voltage to the gate electrode in order to be in the ON state or amplification state. This function is the key to switch the device from the information addressing state or amplifier circuit that drives electrical signal, wherein the current flowing in the semiconductor depends on the electric and ionic charge capacity per unit area of the dielectric being used. FIGS. 3 to 5 are schematic representations of field effect transistors with different types of interface passivation or with matching layer.

The materials to be used as active p-type semiconductors for the transformation of the channel region, referred to as number 10 in FIGS. 3 to 5, are mainly based on the following:
- a) Copper monoxide with Cu metal species embedded in its structure $[(OCu_2)_x+(Cu_{1-2})_y$, wherein $0.05 \leq x < 1$ and $0.01 \leq y \leq 0.9]$;
- b) Tin monoxide with Sn metal species embedded in its structure $[(OSn)_z+(Sn_{1-2})_w$ wherein $0.05 \leq z < 1$ and $0.01 \leq w \leq 0.9]$;
- c) Monoxide of alloys comprised by copper and tin containing Cu and Sn metal species in its structure, in single form or as an alloy $[(O-Cu-Sn)_a+(Cu_\alpha-Sn_\beta)_b$ with $0<\alpha<2$ and $0<\beta<2$, wherein $0.05 \leq a < 1$ and $0.01 \leq b \leq 0.9]$;
- d) Nickel monoxide containing Ni and Sn metal species in its structure, in single form or as an alloy $[(O-Ni)_a+(Ni_\alpha-Sn_\beta)_b$ with $0<\alpha<2$ and $0<\beta<2$, wherein $0.05 \leq a < 1$ and $0.01 \leq b \leq 0.9]$.

They exhibit resistivity between $10^{11}$-$10^0$ $\Omega$cm, as a function of the composition and oxygen partial pressure used during the fabrication processes. The technology of processes to be used is described in item 1 of the present detailed description. The effective thickness of the drain and source regions are in the range of 1-1000 nm. That is, the selected thickness will be a function of the free carrier concentration, which is intended to be high. In this way, the more resistive it is the thicker will be the material. Also for applications wherein the continuity in the union of discrete media is to be ensured, such as, for example, connection of discrete channel regions, the drain regions should be thick, and to ensure the continuity of the connection of the drain contact, over all the discrete elements constituting the discrete channel regions.

For processing the source and drain regions, referred to as numbers 6 and 7, and the gate electrode, referred to as number 2 in FIGS. 3 to 5, the previously mentioned semiconductors from a) to d) may be used, as low resistivity materials, between $10^0$-$10^{-6}$ $\Omega$·cm, using the same technologies previously mentioned. The effective thicknesses of these regions vary between 2-1000000 nm.

Besides these materials, metals such as gold, titanium, aluminum, chromium, copper, nickel, silver and alloys thereof, in single or stacked form, may be used for fabricating the drain and source regions, being directly deposited onto the edges of the channel region, as well as being used for the fabrication of the gate electrode.

Besides these materials, highly conducting oxides, such as indium and zinc oxide, zinc and aluminum oxide, zinc and gallium oxide, zinc and tin oxide, zinc, indium and tin oxide, fluorine-doped tin oxide and others may be used for fabricating the drain and source regions, being directly deposited onto the edges of the channel region, as well as being used for the fabrication of the gate electrode.

Besides these materials, highly conducting polymers, such as pentacene, may be used for producing the drain and source regions, being directly deposited onto the edges of the channel region, as well as gate electrode. In addition, the drain, source, and gate electrodes might be based on the same material, or the material of the gate electrode may be different from the materials used for fabricating the drain and source regions.

In the specific case when a glass substrate is selected, one can start the manufacture process of the device by depositing onto it the gate electrode, see FIG. 3 (2), using a conducting oxide, such as ITO or IZO, or a metal, such as gold, for example, using the lift-off technique (mask #1), with the desired geometry and a well defined separation between the electrodes, as well as the connection thereof to the pad contacts, including also the admissible tolerances, the manufacture being processed at temperatures preferably below 100° C.

After the deposition of the gate electrode it follows the deposition of the dielectric material referred to as (3) with the suitable thickness, in the range of 10 nm to 2000 nm, see FIG. 3, using an inorganic material, such as silicon dioxide or silicon nitride, or an organic material, such as Mylar, or other single or multi-stacked structure, such as, e.g. tantalum oxide, hafnium, zirconium, ytria, alumina, or compounds of hafnium/tantalum oxide, alumina/tantalum oxide, hafnia/alumina; silicon dioxide/tantalum pentoxide, tantalum oxide/ytria; zirconia tantalumm pentoxide/silicon dioxide, alumina/titanium oxide or PMMA, or Poma, or Mylar, at temperatures below 250° C., wherein the deposited layer should also be highly compact to reduce the leakage current as much as possible, and possess the desired work function to achieve the required band-offset, when connected to the layer constituting the channel region by direct deposition, wherein these materials may be amorphous or nanocrystalline or polycrystalline but exhibit a surface as smooth as possible, followed by the definition of the geometry and configuration of the region intended for the dielectric, using a standard lithographic process, or the lift-off technique, or a mask, or direct writing over the deposited material.

In the present example, the deposition over the dielectric of a positive photo-resist (resin) will now protect the regions that will not be removed, and the other unprotected regions will be selectively removed when exposed to a wet or dry etching agent, that is, the dielectric material is removed from the unprotected regions, without implying the removal of the conductive gate electrode that normally has larger dimensions than the gate dielectric.

Once the dielectric is deposited, it follows the deposition of the matching layer, see FIG. 3, (4), with a thickness of 0.5 nm to 1000 nm, depending on the surface morphology selected for the dielectric, with a tolerance below 0.15% from the previously selected dimensions, as a function of the type of dielectric used, using the same mask as before.

Then follows the deposition of the channel layer, comprising the deposition of one of the p-type oxides listed from a) to d), whose mask size is slightly smaller than the previous one (dielectric), with channel lengths that may vary between 5 nm and 6000 nm, as a function of the used masks (with variable widths 5-60000 nm), with thicknesses of the channel layer that vary in the range of nm to 10000 nm, as a function of the envisaged application, respectively in nanoelectronics or microelectronics or other, processed at temperatures preferably below 250° C., and wherein the final geometry is achieved by using either the lift-off technique, or shadow masks, or direct writing over the substrate, or the standard lithography process (mask #3), followed by the etching process as described above for the dielectric layer, but now using different chemical etching agents and different process times, that allow obtaining the aimed selectivity, that is, to etch the channel material in regions not protected by the photo-resist without affecting the dielectric or matching layers, previously deposited and etched, according to the selected mask, followed or not by annealing at temperatures between 50° C. and 300° C., as a function of the envisaged application and substrate material selected, under a controlled or uncontrolled atmosphere.

Once the dielectric is deposited and the channel geometry is defined, the deposition of the drain and source regions takes place, using the most suitable manufacture tolerances compatible with the characteristics of the systems to be used, which can be one of the inorganic or organic or hybrid highly conductive materials already mentioned above, p-type or n-type (referred to as passive semiconductors or metals) with a highly conductive character (conductivity larger than $10^2$ S·cm$^{-1}$).

The geometry of the source and drain regions, see FIGS. 3 to 5, (6) and (7) and corresponding metal pad contacts (8) for the external connections, whose width is a function of what was established for the layer of the channel region plus said tolerance, may have dimensions that can vary between $3 \times 10$ nm and $3 \times 10^6$ nm in size and whose final design (mask #4) is achieved by using either the lift-off technique, or shadow masks, or direct electron or ion writing onto the substrate, or the standard lithography process, followed by the etching process as described for the channel layer, but now using different gases or chemical solutions for selectively etching the deposited materials, involving different etching process times, that is, to etch the drain and source, these materials being etched from the unprotected regions (using negative photo-resist) without the layers that constitute the channel, the dielectric, or the matching layers, followed or not by a thermal treatment at temperatures preferably between 50° C. and 300° C., as a function of the intended application and the type of substrate material selected, under a controlled or uncontrolled atmosphere.

The deposition of the TFT with the predefined structures precedes its encapsulation, with or without using again a matching layer, which consists in depositing a thin layer, such as MgF or silicon nitride layer, with a thickness between 1 nm and 1000 nm, see FIG. 3, (9), using one of the techniques already described, wherein in normal situations the deposited films have thicknesses in the range of 100-300 nm, being necessary to open the contact windows for performing the required connections corresponding to the metal pad contacts, (mask #5), by means of a lithographic technique, such as lift-off, or shadow mask, or direct writing, or standard lithography, followed or not by a thermal treatment under controlled atmosphere, at temperatures preferably up to 300° C., using times that may vary between 20 minutes and twelve hours, as a function of the substrate used.

In case the thermal treatment is performed at the level either of the deposited layers or the final device, the controlled atmosphere under which the annealing takes place may contain an inert gas, such as argon, or an almost inert mixture, such as 95% nitrogen with 5% hydrogen, or a reactive atmosphere, like oxygen, hydrogen, or fluorine. Besides the configurations already described, wherein the first step consists in the deposition of the gate electrode, the other configuration starts with the deposition of the drain and source regions, using the lift-off technique, followed by the deposition of the channel region that overlaps the previous ones at the edges, see FIG. 4, followed by the deposition of the matching layer and the dielectric, separately or individually configured via lithography, followed by the deposition of the gate electrode and finally the encapsulating step, with the corresponding contact windows opened to allow the connections for the pad contacts of the gate, drain, and source electrodes, respectively. As previously described, this step may be followed by annealing at temperatures preferably below 300° C.

The electric performance of these devices is translated into their output and transfer characteristic curves, respectively, whose proof-of-concept is given by FIGS. 12 and 13, for a transistor whose p-type channel is based on copper monoxide incorporated with copper metal species $[(OCu_2)_x + (Cu_{1-2})_y$, wherein $0.05 \le x < 1$ and $0.01 \le y \le 0.9]$ deposited onto glass substrates, in which the gate electrode is based on indium and tin oxide, the dielectric is based on a mixture of titanium oxide and alumina, and the drain and source regions are made of gold; FIGS. 14 and 15 represent the same output and transfer characteristics but now for a transistor wherein the p-type channel is based on tin monoxide embedded with tin metal species $[(OSn)_z + (Sn_{1-2})_w$, wherein $0.05 \le z < 1$ and $0.01 \le w \le 0.9]$ deposited onto glass substrates, in which the gate electrode is based on indium and tin oxide, the dielectric is based on a mixture of titanium oxide and alumina, and the drain and source regions are made of gold; FIGS. 16 and 17 show the same characteristics for a p-type channel based on the same material and with all the other components equal, but now the dielectric and the substrate consist in paper, the gate electrode is based on zinc and indium oxide, and the drain and source are made of gold.

B—Method for the Manufacture of CMOs Devices and Inverters

The example described herein consists in using two field effect transistors, one of the n-type (12) in enhancement mode operation and based on an organic or inorganic semiconductor, such as GSZO or ATO, and the other of the p-type (11) based on one of the four processes and p-type oxides claimed in the present invention and described from a) to d), in enhancement mode (C-MOS application) or depletion mode operation wherein the p-type TFT acts as a dynamic charge (application as an inverter), produced according to previously described techniques, wherein the separation between the active regions of both transistors may vary between 10 nm and 900 µm, with or without the passivation layer or both, whose dielectric may be one of the materials already described in A, which determines the electrical capacitance thereof and corresponds to the fabrication of a so-called C-MOS device or inverter. In this type of circuit, the two transistors are never simultaneously on, allowing their use in the design of digital circuits and design of logic gates.

It should be clear that the application examples and the embodiments of these devices and circuits of semiconductors, and their applications previously described are simply possible examples, described herein for a better understanding of the principles of the invention. Variations and modifications in these examples are possible without affecting the spirit and scope of the described invention. All these modifications and variations are intended to be included in the scope of this document of the present invention and, as such, to be protected by the claims of the invention.

C—Method for the Preparation and Manufacture of p-n and MIS Diode Junctions pn-Type heterojunctions may be manufactured using two types of different materials, such as n-type inorganic active oxides, like GSTZO or AZTO, or n-type covalent semiconductors, such as silicon, or low resistivity organic semiconductors, see FIG. 18 (5), with a thickness between 30-500000 nm, followed by the deposition of a thin matching layer that can be made of tantalum oxide, in single form or multilayered with silicon oxide or silicon nitride, with a thickness below 1 nm, see FIG. 18 (4), followed by the deposition of the p-type monoxide as active semiconductor, always incorporated with metal species, as mentioned in item 1 of a) to d) of the present invention, see FIG. 14, (10), with a thickness of 5-20000 nm, in order to achieve the required rectifying diode effect, followed or not by a thermal treatment, as already previously described, and whose final design of the device should be according to the intended application, using the same type of lithographic steps during the manufacture, as already described.

FIG. 19 illustrates a Metal Insulator Semiconductor-type diode, the so-called MIS structure. In FIG. 19 there is no matching layer between the different interfaces of the dielectric. The active semiconductor is always a p-type oxide based on copper, or tin, or copper and tin alloy, or nickel, or tin and nickel alloy monoxide. Independently of the p-type oxide selected, the device may be manufactured by well known physical, chemical, or physical-chemical deposition techniques, such as the ones already described in section 1 for processing p-type oxides that constitute the set of claims of the present invention.

The working principle of these devices is based on the so-called field effect principle, in which the charges collected in the semiconductors are a function of the electric field applied to the metal electrode, referred to as gate electrode, and wherein the charge flow in the active semiconductor, respectively between the drain and source regions, is a function of the capacitance per unit area of the dielectric used.

Applications

The main industries that presently might benefit from the materials and methods resulting from the use of this innovation for the manufacture of devices, circuits, and integrated systems are the entire electronics industry, the semiconductor industry, the industry of memories and the like, the industry of logic circuits, the instrumentation and sensor industry, the medical and biotechnological industry, the optoelectronics industry, the micro and nanoelectronics industry; the industries connected to the information and communication systems, including the industries of written press and smart packages; the industry connected to electronic vision systems; the security industry, namely through the design of invisible devices; the defense industry, and others alike.

The object of the present invention is to develop and create a product or products processed at room temperature or temperatures up to 250° C., using simple, economical, and conventional processing techniques, using rigid substrates, such as glass, or flexible ones, such as polymer, mylar, or paper, in which case this can also act simultaneously as dielectric.

On the other hand, the required technological processes of manufacture are compatible with the ones already existing in the electronics, or optoelectronics, or semiconductor industry, namely the sputtering processes for large areas, or thermal evaporation, or sol-gel, or ink-jet, thereby not requiring high investments, in terms of research and technological adaptation.

The technical advantages provided by the present invention allow the active use of p-type oxides in the development of electronic and optoelectronic devices, either transparent or not.

Although the preferred embodiment has been described in detail, it should be understood that several variations, substitutions and changes may be introduced without departing from the scope of the present invention, even if all the advantages identified above are not present. The embodiments presented herein illustrate the present invention, which can be embodied and incorporated in a variety of different forms within the scope of the same. Also the techniques, constructions, elements, and processes described and illustrated in the preferred embodiment as distinct or separated may be combined or integrated with other techniques, constructions, elements, or processes, without departing from the scope of the invention. Although the present invention has been described in several embodiments, these may still be modified according to the description of the present invention. Other examples of variations, substitutions, and changes are easily determinable by those of skill in the art and might as well be introduced.

The potential users of the present materials and devices constituting the present invention are the entire electronics and semiconductor industries, focusing on the ones related to information and communication technologies, namely the one involved in the manufacture of displays, logic circuits, ring oscillators, shift registers, RFID, smart labels, invisible electronics for security applications, smart instruments (including sensors), electronic components for medical applications, solar cells, and others related to the emergent fields of biotechnology and nanoelectronics. In the set of the above mentioned industries, the p-type oxides claimed in the present invention have a big advantage from what is known about the present state of the art and technology, since they can be processed at low temperatures, such as room temperature, thereby allowing the use of low cost and disposable flexible substrates, like polymers and paper. Apart from that, they will also allow the fabrication in much better conditions of active matrices for OLED, due to the p-type intrinsic nature of the organic semiconductors.

The proposed p-type oxides will enable the production of totally transparent, totally oxide-based C-MOS devices, thereby allowing the fabrication of a multitude of new devices, similar to the ones presently manufactured using silicon technology, having as great advantage the possibility of being processed at low temperatures with the relevant electronic performance, as required by the industry.

The purpose of the objects of the present invention is to manufacture and develop products using simple and economical existing technologies, at low temperatures (below 250° C.), that allow the manufacture of large areas, involving environment friendly materials and gases. The technologies that may be used are the following: RF and DC sputtering (either assisted or not by magnetron); (resistive and electron gun) thermal evaporation; plasma-assisted Chemical vapor deposition; sol gel; ink-jet printing, among others.

Transparent P-Type $SnO_x$ Thin Film Transistors Produced by Reactive rf Magnetron Sputtering at Low Temperature We successfully report p-type thin-film transistors (TFTs) using room temperature sputtered $SnO_x$ (x<2) as a transparent oxide semiconductor. The as-deposited $SnO_x$ films present an amorphous structure and n-type conduction, which can be modified by a low temperature annealing (e.g. 250° C.) into a polycrystalline structure with a mixture of tetragonal β-Sn and α-SnO phases that presents a p-type electronic behavior. The p-type active oxides used as the channel layer of the TFTs present an optical band gap of 2.8 eV and an average transmittance around 85% in the wavelength range between 400 and 2000 nm. The bottom gate p-type TFTs with $SnO_x$ semiconductor layer present a field-effect mobility above 1 cm$^2$/Vs, an ON/OFF modulation ratio≥10$^3$, a threshold voltage between −5 and −12 V (enhancement mode operation), as a function of the oxygen partial pressure used to deposit the $SnO_x$ films, and do not show relevant aging effects after five months of being produced. These results are expected to contribute significantly to the development and implementation of complementary MOS (CMOS) structures, in the areas of flexible, low cost and transparent electronics.

Although the performance achieved with oxide transistors processed at low temperatures exceeds far beyond the ones obtained with amorphous silicon and organic semiconductors, the oxides reported in the literature are mostly limited to n-type device applications, since there is a lack of p-type oxide semiconductors, mainly regarding the ones processed at low substrate temperatures. This confines the field of application of oxide semiconductors solely to unipolar (n-type) devices, inhibiting the fabrication of complementary MOS (CMOS) structures where both n- and p-type transistors are needed, as demanded for the next generation of flexible and disposable low cost electronic systems, away from the traditional silicon technology.

In spite of the recent developments concerning p-type oxide TFTs, the results achieved so far refer to devices typically processed at temperatures above 575° C. and are limited by the low hole mobilities.[22,23] The valence band maxima (VBM) of oxide semiconductors are mainly formed by localized and anisotropic O 2p orbitals, which leads to the low hole mobility due to hopping conduction. However, SnO has a specific electronic structure associated with the presence of divalent tin, Sn(II), in a layered crystal structure with a Sn—O—Sn sequence and a van der Waals gap between Sn layers≈2.52 Å. O atoms are tetrahedrally bonded to Sn ones, with Sn—O distances equal to 2.224 Å.[24] The Sn atoms are located at the top of regular square-based pyramids whose base is constituted by four O atoms. In the case of SnO, the higher-energy region of valence band contains Sn 5s, Sn 5p and O 2p components nearly equally, but very near the VBM the contributions of Sn 5s and O 2p are predominant. In the conduction band, the O 2p component is relatively small and the states near the conduction band minimum (CBM) are mainly formed by Sn 5p. Consideration of the hole transport paths leads us to expect that structures mainly dominated by tin monoxide clusters with some embedded tin cations in which VBM is made of spatially spread s orbitals would have a large hole mobility and would be good candidates for p-type oxide semiconductors. The origin of p-type conductivity of SnO is mainly attributed to Sn vacancies and/or O interstitials.[25] If there is excess oxygen in the film, some cations will be transformed into $Sn^{3+}$ in order to maintain charge neutrality. This process can be considered as $Sn^{2+}$ capturing a hole and forming weakly bonded holes. These holes are located inside the band gap near the top of the valence band and serve as acceptor states in the energy band structure. While cation vacancies form more easily than O interstitials in most metal oxides with densely packed structures, the layered structure of SnO with the open spaces surrounded by $Sn^{2+}$ may facilitate the formation of O interstitials. Still, it was demonstrated by Togo et al. that the p-type conductivity of SnO is mainly provided by Sn vacancies.

As mentioned before, reports of p-type oxide thin-film transistors (TFTs) are scarce in the literature. To the author's knowledge, only two recent works show evidence of field-effect in devices employing p-type oxide semiconductors, one with $Cu_2O$ and other with SnO. However, both works fail to present suitable processes for large area, flexible and low cost industrial applications, mainly due to the method of preparation of the p-type oxide, since they rely on pulsed laser deposition (PLD) to grow epitaxial layers of these semiconductors onto single crystalline substrates, at temperatures above 575° C.

In this work we report p-type oxide TFTs based on transparent $SnO_x$ semiconductors deposited by reactive rf sputtering at room temperature, with the final devices requiring, for example, annealing temperatures of only 250° C. in order to exhibit improved electrical properties over similar devices reported in the literature, produced at considerably higher temperatures. The good performance achieved and the possibility to fabricate devices with controllable threshold voltage ($V_T$), depending on the processing conditions of the $SnO_x$ films, permit a promising future integration of these devices with the already well-established n-type oxide TFTs in flexible, low-cost and transparent CMOS structures. Furthermore, the sputtering technique presents a great advantage regarding the industrial migration of these devices, as it has been widely used by the industry due to the easy control of the deposition parameters and the possibility of obtaining uniform films over large surfaces.

$SnO_x$ films were grown by reactive rf magnetron sputtering at room temperature in a home made system. A 5 cm diameter Sn metal target from SCM (with 99.999% purity) was used at cm from the substrate (soda-lime glass), at a base pressure of $3.4\times10^{-4}$ Pa. The deposition pressure ($Ar+O_2$) and the rf power were 0.2 Pa and 50 W, respectively. In order to evaluate the optimal growing conditions for p-type $SnO_x$ films, the oxygen partial pressure ($O_{PP}=O_2/Ar+O_2$) was varied between 0 and 40%. Considering the other processing conditions used herein, the growth of p-type $SnO_x$ films is namely more favorable for an $O_{pp}$ between 5% and 15%, tolerances notwithstanding of 1%, 2%, 5%, 10%. The deposition time was adjusted to obtain films with a thickness around 200 nm for all the processing conditions. The thicknesses of the films were measured with a surface profilometer Sloan Tech Dektak 3. X-ray diffraction experiments were performed with a Bruker-AXS D8-Disvover in Grazing Incidence geometry using $CuK_{\alpha1,2}$ lines collimated with a Gobël mirror and a divergent slit of 0.6 mm. An incidence angle of 1.5° and a 2e range from 20° to 70° using a 0.12° soller slit with a step size of 0.04 and an acquisition time of 3s were used. The optical transmittance measurements were performed with a Shimadzu UV/VIS 3100 PC double beam spectrophotometer in the wavelengths from 200 nm to 2500 nm. Electrical transport properties were examined by Hall Effect measurements using samples with the van der Pauw configuration (defined using shadow masks) at room temperature. Sheet resistance of highly resistive films was measured with an Agilent 4155C semiconductor parameter analyzer and a Cascade Microtech M150 microprobe station, using a four-point probe setup and the same van der Pauw samples used for Hall measurements.

Bottom-gate TFTs were fabricated using 30 nm thick $SnO_x$ thin films as semiconductors. For the gate dielectric an engineered insulator consisting of a superlattice of $Al_2O_3$ and $TiO_2$ (ATO)[26] with a thickness of 220 nm deposited onto a glass coated with a 200 nm thick Indium Tin Oxide (ITO) film was used. For the source-drain electrodes, double layered Ti/Au (8/50 nm thick) films were e-beam evaporated using a home-made evaporation system. Both the semiconductor and the source-drain electrodes were patterned by lift-off, TFTs being obtained with a width-to-length ratio (W/L) of 1.2, with L=40 μm. The final devices were annealed at 250° C. for 1 hour in air using a Barnstead Thermolyne F21130 tubular furnace and the electrical characterization was performed with a relative humidity of 35-40%, with an Agilent 4155C semiconductor parameter analyzer and a Cascade Microtech M150 microprobe station. All the electrical measurements were done inside a dark box at ambient atmosphere.

FIG. 20 shows the X-ray diffractograms of the as-deposited (amorphous) and annealed SnO films for an $O_{pp}$=7.0%. After annealing in air atmosphere at temperatures namely above 200° C. crystallization occurs and a mixture of both tetragonal β-Sn and α-SnO phases are found, which is caused by the incomplete Sn oxidation or/and metal segregation due to oxygen disproportionation. It was reported in the literature that internal oxygen disproportionation distribution at intermediate temperatures leads to metallic Sn segregation during the heating and annealing processes, which explains the appearance of the metallic phase. It is well known that tin oxide exists in two main forms: stannous SnO and stannic $SnO_2$. SnO generally crystallizes in a tetragonal structure, but depending on the conditions of preparation it may also crystallize in an orthorhombic phase. On the other hand, stannic tin oxide ($SnO_2$) crystallizes in a rutile structure usually for higher temperatures. In this study the $SnO_2$ phase does not appear, mainly due to the deposition conditions used, which are more favorable for the SnO phase.

FIG. 21 shows the dependence of the electrical resistivity ($\rho$) as a function of $O_{pp}$ for as-deposited and annealed films. As the $O_{pp}$ increases $\rho$ also increases, and two different electronic conduction behaviors are observed after annealing, depending on the $O_{pp}$ range: in fact, although all the as-deposited SnO films exhibit n-type conductivity (measured by Hall effect), after annealing only the films produced with an $O_{pp}$ typically between 5 and 15% present p-type characteristics. In this $O_{pp}$ range $\rho$ increases after annealing, while for films processed outside this $O_{pp}$ region $\rho$ decreases. These different behaviors are reinforced by X-ray photoelectron spectroscopy (XPS) measurements (not presented in this work), where an increase of the O/Sn ratio between 40 and 60% (depending on the processing conditions) is observed for the p-type samples after annealing. By Hall effect measurements it is also verified that in the p-type films the carrier concentration (P) can be adjusted between $\approx 10^{16}$ and $10^{18}$ $cm^{-3}$, corresponding to a maximum Hall mobility ($\mu_H$) of 4.8 $cm^2/Vs$. The p-type characteristics are also confirmed by thermoelectric measurements, where a positive Seebeck coefficient is obtained, indicating that the majority of the carriers in $SnO_x$ are holes. This is caused by the fact that, for the $O_{pp}$ range mentioned above, the p-type conductivity is caused by O atoms in interstitials or vacancies in the Sn sublattice acting as acceptors, while for higher $O_{pp}$ the n-type behavior is due to the existence of Sn atoms in interstitials and O vacancies.[12,30-32] For lower $O_{pp}$ (typically <5%) a metallic behavior is observed, with an average $\rho$ of $4.4 \times 10^{-5}$ $\Omega cm$, typical of metallic Sn ($1.2 \times 10^{-5}$ $\Omega cm$). In fact, X-ray analysis confirms that for $O_{pp}$<5% β-Sn is the predominant phase. As it was observed by other authors p-type $SnO_x$ is only obtained in a very narrow region of growth conditions, since $SnO_2$ is formed for higher $O_{pp}$, whereas metallic Sn precipitates at lower $O_{pp}$. Since the growth of SnO requires a reducing atmosphere and the vapor pressure of SnO and Sn is high, the deposition at room temperature can be a promising advantage, since it inhibits the re-evaporation of deposited thin films.

The optical band gap ($E_{op}$) of the $SnO_x$ thin films is calculated using the Tauc law: $\alpha^x = (hv - E_{op})$, wherein $\alpha$ represents the absorption coefficient, h the Planck's constant and $v$ the photon frequency. Although some authors report the existence of an indirect transition around 1.3 eV,[23] $SnO_x$ is generally considered to be a direct band gap semiconductor, hence x assumes the value of 2 in the Tauc relation. $E_{op}$ is estimated by extrapolating the linear region of the $\alpha^2$ versus hv plot, near the onset of the absorption edge, up to the photon energy axis. FIG. 22 show the dependence of $E_{op}$ on $O_{pp}$ for as-deposited and annealed $SnO_x$ thin films. As $O_{pp}$ increases we observe also an increase in $E_{op}$ up to an $O_{pp}$ of 20%, after that the $E_{op}$ decreases from 2.8 to 2.6 eV without a remarkable difference between as-deposited and annealed $SnO_x$ films. For lower $O_{pp}$ (typically <5%) it is observed a decrease in the $E_{op}$, which is explained by the incomplete oxidation of metallic Sn, as confirmed by the X-ray analysis. For higher $O_{pp}$ (typically >20%) $E_{op}$ decreases, suggesting the presence of an indirect band gap. The previous values of Opp are notwithstanding tolerances of 1%, 2%, 5%, or 10%. Still, a more detailed analysis is required to clarify these trends, as the interpretation of the properties of this type of materials is complex due to their composite nature. The inset shows the transmittance as a function of wavelength for as-deposited and annealed $SnO_x$ films produced with $O_{pp}$=11.5%, where it is clearly observed an increase of the optical transmittance after annealing, resulting in an increment of $E_{op}$ from 1.71 to 2.78 eV. Note that even if the transmittance obtained for these thick p-type films is not typical of transparent semiconductors, the transmittance is considerably improved up to $\approx$85% (between 400 and 2500 nm) when similar films are grown with a thickness of 30 nm to be used as the active layer of the TFTs. The previous values of Opp are notwithstanding tolerances of 1%, 2%, 5%, or 10%.

FIGS. 23 a) and b) show the output characteristics of two TFTs wherein the $SnO_x$ layer was fabricated with $O_{pp}$=7.0 and 11.5%, after annealing under air at 200° C. The drain-to-source voltage ($V_{DS}$) is swept from +0 to −30 V and the gate-to-source voltage ($V_{GS}$) is stepped between −30 and +10 V. The devices show clear linear and saturation regions of the output characteristics and do not present significant current crowding for low $V_{DS}$, indicating low series resistance in source-drain contacts with $SnO_x$.[34] The maximum $I_{DS}$ in FIG. 4a) ($O_{pp}$=7.0%) is twice the one in FIG. 4b) ($O_{pp}$=11.5%), but the latter shows improved saturation, indicating easier channel depletion (pinch-off) close to the drain electrode for higher $O_{pp}$, due to the lower background P under these conditions. FIG. 23 c) shows the transfer characteristics with $V_{DS}$=−1 V for the same devices presented in FIGS. 4a) and b). $V_{GS}$ is swept between −30 and +30 V. The right axis shows the leakage current ($I_{GS}$) and the obtained value is quite low, below 0.1 nA for the used $V_{GS}$ range, showing that ATO provides good insulating properties even for large negative bias. The ON/OFF ratio of both devices is $\geq 10^3$, the field-effect mobility ($\mu_{FE}$, calculated by the transconductance in the linear regime) is between 1.1 and 1.2 $cm^2/Vs$, while the $V_T$ is adjustable between −5 and −12 V, for an $O_{pp}$ of 7.0 and 11.5%, respectively, meaning that both devices work in enhancement mode. The electrical properties of the p-type TFTs do not show significant variations after five months of device processing, proving that even without an encapsulation layer these devices are environmentally stable. FIG. 23 d) shows some optical micrographs of the produced p-type oxide TFTs as well as the type of structure used.

In summary, we have demonstrated the possibility to produce transparent oxide semiconductors based on $SnO_x$ by reactive magnetron sputtering without intentional substrate heating, that exhibit p-type conductivity after a low temperature annealing typically at 250° C. The $SnO_x$ films are polycrystalline, presenting a mixture of both tetragonal β-Sn and α-SnO phases. The p-type conductivity is obtained for a narrow $O_{pp}$ range, typically between 5 and 15%, wherein these films exhibit P in the range of $\approx 10^{16}$-$10^{18}$ $cm^{-3}$, $\rho$ between $10^1$ and $10^2$ $\Omega cm$ and a $\mu_H$ reaching a maximum of 4.8 $cm^2/Vs$. Concerning the optical properties, the p-type films present $E_{op} \approx 2.8$ eV and for a thickness of 30 nm the films have an average transmittance around 85%, between 400 and 2500 nm. Bottom gate p-type TFTs with $SnO_x$ channel layer present a $\mu_{FE} \approx 1.1$-1.2 $cm^2/Vs$, an ON/OFF modulation ratio$\geq 10^3$ and a $V_T$ adjustable between −5 and −12 V, depending on $O_{pp}$. Furthermore, the properties remain stable after 5 months of device production. The low temperature process and the compatibility of the $SnO_x$ deposition technique with large area industrial implementation, together with the good electrical performance of the devices at this early research stage, open new doors for the future optimization of p-type oxide-based devices and for their integration in CMOS structures, that can be used in flexible, low cost, and transparent electronic circuits.

All of the above that applies to $SnO_x$ also applies to the species Cu, Ni, and respective alloys or combinations, with the necessary adaptations by someone with knowledge in the field.

Thin-Film Transistors Based on p-Type $Cu_2O$ Thin Films Produced at Room Temperature Copper oxide ($Cu_2O$) thin films were used to produce bottom gate p-type transparent thin-film transistors (TFTs). $Cu_2O$ was deposited by reactive rf magnetron sputtering at room temperature and the films exhibit a polycrystalline structure with a stronger orientation along the (111) plane. The TFTs exhibit improved electrical performances, such as a field-effect mobility of 3.9 $cm^2$/Vs and on/off ratio of $2 \times 10^2$.

Solid state devices based on cuprous oxide ($Cu_2O$) semiconductors are known for more than 80 years, even before the era of Si devices. Rectifier diodes based on this semiconductor were used industrially as early as 1926[16] and most of the theory of semiconductors was developed using the data on $Cu_2O$ devices.[17-19] Besides that, $Cu_2O$ was regarded as one of the most promising materials for application in solar cells[20-22] due to its high absorption coefficient in the visible region, non-toxicity, abundant availability, and low-cost production.[23] $Cu_2O$ has a cubic structure with a direct band gap of 2.1 eV[24] and shows p-type conductivity with hole mobility exceeding 100 $cm^2$/Vs.[25] The p-type character of $Cu_2O$ is attributed to the presence of negatively charged copper vacancies ($V_{Cu}$), which introduce an acceptor level at about 0.3 eV above the valence band ($V_B$).[26] It was also proposed by some authors the co-existence of both intrinsic, acceptor and donor levels with a ratio slightly larger than 1 and less than $10^2$.[27,28] The nature of the donor levels is not completely clear, being even controversial, wherein the simplest candidates are oxygen vacancies.[29] In contrast to the majority of metal oxides, in which the top of $V_B$ is mainly formed by localized and anisotropic O 2p orbitals, which leads to a low hole mobility due to hopping conduction, here the top of the $V_B$ is composed by fully occupied hybridized orbitals (Cu $3d^{10}$ and O 2p) with Cu d sates dominating the top of the $V_B$. FIG. 24 a) illustrates the chemical bond between an oxide ion and a cation that has a closed-shell electronic configuration; FIG. 24 b) shows a pictorial representation of the most important defects in $Cu_2O$, and FIG. 24 c) reveals the simple electronic model proposed by Brattain,[27] consisting of a compensated semiconductor with one acceptor level at 0.3 eV and a deep donor level at 0.9 eV from the $V_B$.

The development of p-n junctions and p-type thin film transistors (TFTs) is a major goal for material scientists, as this would lead to the fabrication of complementary MOS (CMOS) structures where both n- and p-type transistors are needed, as demanded by the next generation of flexible and disposable low cost electronic systems, away from the traditional silicon technology.

The interest in this field was renewed in 1997 when Kawazoe et al.[30] reported p-type conductivity in a highly transparent thin film of copper aluminum oxide ($CuAlO_2$). Following this development, the research on Cu-based p-type oxide semiconductors has been widely increased.

Despite the fact that high quality p-type Cu-based oxide semiconductor thin films have already been achieved,[12,25,31,32] so far there is only one report on p-type $Cu_2O$ TFTs[12] but without satisfactory requirements for practical applications. In that case, the method of preparation used is not suitable for large area, flexible, and low cost industrial applications, since it relies on pulsed laser deposition to grow $Cu_2O$ epitaxial layers onto single crystalline substrates, at temperatures above 575° C.

In this work we report on p-type oxide TFTs based on $Cu_2O$ semiconductors deposited by reactive rf magnetron sputtering at room temperature, with the final devices requiring annealing temperatures of only 200° C. to exhibit improved electrical properties over similar devices reported on the literature, produced at considerably higher temperatures. Besides that, the drain and source regions are based on transparent conductive oxides that proof to be superior to metal films to work as injector contacts, due to their high work function.

The good performance achieved and the possibility to fabricate p-type TFTs precludes a promising future integration of these devices with the already well-established n-type oxide TFTs in flexible, low-cost and transparent CMOS structures. Furthermore, the sputtering technique presents a great advantage regarding the industrial migration of these devices, as it has been widely used by the industry due to the easy control of the deposition parameters and to the possibility of obtaining uniform films over large surfaces.

$Cu_2O$ films were grown by reactive rf magnetron sputtering at room temperature in a homemade system. An approximately 5 cm diameter Cu metal target of SCM (with 99.997% purity) was used at 15 cm from the substrate (soda-lime glass), at a base pressure of $3.4 \times 10^{-4}$ Pa. The deposition pressure $P_{Ar}+P_{O2}$) and the rf power were 0.6 Pa and 50 W, respectively. In order to evaluate the optimal growing conditions for p-type $Cu_2O$ films, the oxygen partial pressure ($O_{PP}=P_{O2}/P_{Ar}+P_{O2}$) was varied between 0 and 100%. The deposition time was adjusted to obtain films with a thickness around 200 nm for all processing conditions. The thicknesses of the films were measured with a surface profilometer Sloan Tech Dektak 3. X-ray diffraction experiments were performed with a Bruker-AXS D8-Disvover in Grazing Incidence geometry using $CuK_{\alpha1,2}$ lines collimated with a Goböl mirror and a divergent slit of 0.6 mm. An incidence angle of 1.5° and a 2θ range from 20° to 70° using a 0.12° soller slit with a step size of 0.04 and an acquisition time of 3 s were used. The optical transmittance measurements were performed with a Shimadzu UV/VIS 3100 PC double beam spectrophotometer in the wavelengths from 200 nm to 2500 nm. Atomic Force Microscopy (AFM) was done in order to investigate the surface topology using an Asylum MFP 3D microscope operated in AC mode. Electrical transport properties were examined by Hall Effect and conductivity (σ) measurements as a function of absolute temperature (T), using respectively samples with the van der Pauw and planar gap configurations. Sheet resistance of highly resistive films was measured with an Agilent 4155C semiconductor parameter analyzer and a Cascade Microtech M150 microprobe station, using a four-point probe setup and the same van der Pauw samples used for Hall measurements.

Bottom-gate TFTs were fabricated using 40 nm thick $Cu_2O$ thin films as semiconductors. For the gate dielectric an engineered insulator consisting of a superlattice of $Al_2O_3$ and $TiO_2$ (ATO)[33] with a thickness of 220 nm deposited on a glass coated with a 200 nm thick Indium Tin Oxide (ITO) film was used. For the source-drain electrodes two sets of TFTs were produced: TFT-M with a double layer of Ti/Au (8/50 nm thick) films, evaporated by e-beam using a home-made evaporation system, and TFT-O with a Indium Zinc Oxide (IZO) film with 250 nm produced by rf magnetron sputtering at room temperature.[34,35] Both the semiconductor and the source-drain electrodes were patterned by lift-off, TFTs being obtained with a width-to-length ratio (W/L) of 3.3, with L=15 µm. The final devices were annealed at 200° C. for 1, 5 and 10 hours in air using a Barnstead Thermolyne F21130 tubular furnace, and the electrical characterization was performed with a relative humidity of 35-40%, with an Agilent 4155C semiconductor parameter analyzer and a Cascade Microtech M150 microprobe station. All the electrical measurements were done inside a dark box at ambient atmosphere.

The as-deposited $Cu_2O$ films (9% $O_{pp}$) were annealed at 200° C. in air for 1, 5 and 10 hours. A typical XRD pattern obtained from the films annealed for 10 hours is comparatively shown in FIG. 25 with one of the as-deposited films.

It is found that the annealing is not effective in inducing any change in the $Cu_2O$ phase. However, the increasing intensity of the strongest orientation along (111) with the increase in annealing time has confirmed the improvement in the crystallinity of the as-deposited films. An interesting development is that the films annealed for 10 hours show a relatively negligible peak at the 2θ value of ~38.79°, which is matched with CuO phase. The grain size ($d_g$) inferred from Scherrer formula[36] for as-deposited films is 8.30 nm, gradually increasing with the annealing time to a maximum of 15.55 nm for the films annealed for 5 hours, but then it seems to saturate at 15.72 nm for films annealed for 10 hours. To substantiate the increase in $d_g$, the films were analyzed by AFM (scan area: 2 µm×2 µm) and the obtained microstructures are shown as an inset in FIG. 25. It can be seen that the size of nanocrystallite clusters or agglomerates in as-deposited films ranges between 15 and 40 nm (about ten to fifty nanocrystals), and increases between 50 nm and 130 nm when films are annealed for 10 hours. This increasing trend of grain size with the increasing annealing time is corroborating the $d_g$ obtained from XRD data, as well as the increase in the surface roughness obtained by AFM measurements, from 4.6 to 10.4 nm. The temperature dependence of dark conductivity is shown in FIG. 26 for the films produced with 9% Opp.

These films exhibit the $Cu_2O$ phase and typical semiconductor behavior. From the experimental data we notice that the conductivity data are fitted by two conduction paths controlled respectively by an acceptor energy level $E_A$ and by phonons of energy $W_{ph}$ with which are associated activation energies of about 0.15 eV and 0.03 eV, respectively. Taking into account the equation inside FIG. 26,[37] where the Fermi energy level ($E_F$) is assumed to be around the middle of the energy gap between $E_A$ and the top energy of $V_B$, we estimate $E_A \approx 2\Delta E \approx 2 (E_F-E_V) \approx 0.30$ eV and $W_{ph} \approx 0.06$ eV, agreeing well with the conduction path model proposed by other authors.[27,37-39] A p-type resistivity (ρ) of $2.7 \times 10^3$ Ωcm, a Hall mobility ($\mu_H$) of 0.65 cm²/Vs and a carrier concentration (N) of $3.7 \times 10^{15}$ cm⁻³ were obtained at room temperature. The p-type conduction was also confirmed by Seebeck measurements performed in the same sample. After annealing at 200° C. for 10 hours, ρ and $\mu_H$ increase to $1 \times 10^4$ Ωcm and 18.5 cm²/Vs, respectively, while N decreases to values around $3 \times 10^{13}$ cm⁻³.

The optical transmittance spectrum through the entire $Cu_2O$-TFT in the wavelength range between 200 nm and 2500 nm (including the glass substrate with 1.1 mm thick) is shown in FIG. 27. The average optical transmission in the visible part of the spectrum is 80%, while for 550 nm (maximum sensitivity of the human eye) it is 85%, which indicates that transmission losses due to the $Cu_2O$-TFTs in comparison with the uncoated glass substrate are negligible (7%). The lower transmittance at the near infrared region is associated with the large N of the ITO and IZO films, which shifts the infrared absorption edge towards the visible, this shift being determined by the plasma oscillation of the free carriers.[40]

The optical band gap ($E_{op}$) for direct allowed transitions of the $Cu_2O$ thin films was calculated using the Tauc law: $\alpha^2 = (h\nu - E_{op})$, wherein α represents the absorption coefficient, h the Planck's constant and ν the photon frequency. The obtained value was 2.39 eV, which is slightly higher than the conventional value of 2.1 eV for $Cu_2O$.[41]

FIG. 28 a) shows the output characteristics of a $Cu_2O$ p-type TFT. The drain-to-source voltage ($V_{DS}$) is swept from +10 to −60 V and the gate-to-source voltage ($V_{GS}$) is stepped between +5 and −55 V. The device shows clear linear and saturation regions of the output characteristics and does not present significant current crowding for low $V_{DS}$, indicating low series resistance in source-drain contacts. FIG. 28 b) shows the transfer characteristics with $V_{DS}$=−5 V for the same device presented in FIG. 28 a). $V_{GS}$ is swept between −60 to +10 V. The ON/OFF ratio is $2 \times 10^2$, the field-effect mobility ($\mu_{FE}$, calculated by the transconductance in the linear regime) is around 3.9 cm²/Vs, while the $V_T$ is −12.0 V. The inset in FIG. 28 b) shows the structure of the bottom gate TFT.

In conclusion, we have demonstrated the possibility to produce p-type transparent oxide semiconductors based on $Cu_2O$ by reactive magnetron sputtering. The $Cu_2O$ films are polycrystalline, presenting a strong orientation along the (111) plane. After annealing in air at 200° C. for 10 hours, we improved the Hall mobility from 0.65 to 18.5 cm²/Vs, which is associated with an increase of the grain size from 8.30 to 15.72 nm. Concerning the optical properties, the p-type films present $E_{op} \approx 2.34$ eV and the films have an average transmittance around 85%, between 400 and 2000 nm for a thickness of 270 nm. Bottom gate p-type TFTs with $Cu_2O$ channel layer present a $\mu_{FE} \approx 3.9$ cm²/Vs, an on/off modulation ratio of $2 \times 10^2$ and a $V_T$ of −12.0 V. The low temperature process and the compatibility of the $Cu_2O$ deposition technique with large area industrial implementation, together with the good electrical performance of the devices at this early research stage, open new doors for the future optimization of p-type oxide-based devices and for their integration in CMOS structures, that can be used in flexible, low cost and transparent electronic circuits.

REFERENCES

1. T. Minami et al. *Semicond. Sci. Technol.* 20 (2005) S35-S44.
2. H. L. Hartnagel, A. L. Dawar, A. K. Jain, C. Jagadish, Semiconducting Transparent Thin Films, Institute of Physics Publ., Bristol 1995.
3. E. Fortunato, et al., *Thin Solid Films*, 442 (2003) 121-126.
4. E. Fortunato, et al., *Thin Solid Films*, 451-452 (2004) 443-447.
5. H. Hosono et al. *J. Non-Cryst.* 203, 334 (1996)
6. H Hosono, *J Non-Cryst Solids* 351, 1-19 (2006); K. Nomura, et al. *Nature*, 432 (2004) 488.
7. J. F. Wager, *Science*, 300 (2003) 1245.
8. E. Fortunato et al. pss, rapid research letters, 1, (2007), R34.; E. Fortunato, et al. *Advanced Materials*, 17, 5, (2005) 590.
9. R. Martins et al. *J. Non-Cryst. Solids*, Vol. 352, 1471 (2006); R. Martins et al. *Phys. stat. sol.* (a) 202, No. 9, R95 (2005).
10. Hideo Hosono, Toshio Kamyia, Masahiro Hirano, *Bulletin of the chemical Society of Japan*, 77, 1 (2006) 1-24.
11. H. Hosono, Y. Mishima, H. Takezoe, K. J. D. Mackenzie in "Nanomaterials", Elsevier, Tokyo, Novembro 2006.

12. K. Matsuzaki, K. Nomura, H. Yanagi, T. Kamiya, M. Hirano, H. Hosono, Epitaxial growth of high mobility Cu2O thin films and application to p-channel thin film transistor, *Applied Physics Letters* 93 (2008).
13. Y. Ogo, H. Hiramatsu, K. Nomura, H. Yanagi, T. Kamiya, M. Hirano, H. Hosono, p-channel thin-film transistor using p-type oxide semiconductor, SnO, *Applied Physics Letters* 93 (2008); Y. Ogo, H. Hiramatsu, K. Nomura, H. Yanagi, T. Kamiya, M. Kimura, M. Hirano, H. Hosono, *Physica Status Solidi a-Applications and Materials Science* 206/9 (2009) 2187; Y. Ishida, A. Fujimori, H. Ohta, M. Hirano, H. Hosono, *Applied Physics Letters* 89/15 (2006).
14. D. Hong, H. Q. Chiang, J. F. Wager, Zinc tin oxide thin-film transistors via reactive sputtering using a metal target, *Journal of Vacuum Science & Technology* B 24 (5) L23 (2006).
15. T. Kamiya T (Kamiya, Y. Takeda, K. Nomura, H. Ohta, H. Yanagi, M. Hirano, H. Hosono, Self-adjusted, three-dimensional lattice-matched buffer layer for growing ZnO epitaxial film: Homologous series layered oxide, InGaO3(ZnO) (5), *Crystal Growth & design* 6 (11) 2451 (2006).
16. L. O. Grondahl, *Science* 64, 306 (1926).
17. E. Duhme e W. Schottky, *Naturwissenschaften* 18, 735 (1930).
18. W. Schottky e F. Waibel, *Physikalische Zeitschrift* 34, 858 (1933).
19. W. Schottky e F. Waibel, *Physikalische Zeitschrift* 36, 912 (1935).
20. C. Wadia, A. P. Alivisatos, e D. M. Kammen, *Environ. Sci. Technol.* 43, 2072 (2009).
21. R. J. Iwanowski e D. Trivich, *Solar Cells* 13, 253 (1985).
22. L. C. Olsen, R. C. Bohara, e M. W. Urie, *Appl. Phys. Lett.* 34, 47 (1979).
23. V. Figueiredo, E. Elangovan, G. Goncalves, P. Barquinha, L. Pereira, N. Franco, E. Alves, R. Martins, e E. Fortunato, *Appl. Surf. Sci.* 254, 3949 (2008).
24. M. A. Rafea e N. Roushdy, *J. Phys. D-Appl. Phys.* 42, 015413 (2009).
25. B. S. Li, K. Akimoto, e A. Shen, *J. Cryst. Growth* 311, 1102 (2009).
26. H. Raebiger, S. Lany, e A. Zunger, *Phys. Rev. B* 76, 045209 (2007).
27. W. H. Brattain, *Rev. Mod. Phys.* 23, 203 (1951).
28. G. P. Pollack e D. Trivich, *J. Appl. Phys.* 46, 163 (1975).
29. O. Porat e I. Riess, *Solid State Ion.* 81, 29 (1995).
30. H. Kawazoe, M. Yasukawa, H. Hyodo, M. Kurita, H. Yanagi, e H. Hosono, *Nature* 389, 939 (1997).
31. M. Ivill, M. E. Overberg, C. R. Abernathy, D. P. Norton, A. F. Hebard, N. Theodoropoulou, e J. D. Budai, *Solid-State Electron.* 47, 2215 (2003).
32. S. Ishizuka, T. Maruyama, e K. Akimoto, *Jpn. J. Appl. Phys. Part 2—Lett.* 39, L786 (2000).
33. ITO/ATO-coated substrates from Planar Systems, I. E, Finland (2004)
34. G. Bernardo, G. Goncalves, P. Barquinha, Q. Ferreira, G. Brotas, L. Pereira, A. Charas, J. Morgado, R. Martins, e E. Fortunato, *Synth. Met.* 159, 1112 (2009).
35. E. Fortunato, L. Pereira, P. Barquinha, I. Ferreira, R. Prabakaran, G. Goncalves, A. Goncalves, e R. Martins, *Philos. Mag.* 89, 2741 (2009).
36. P. Scherrer, *Göttinger Nachrichten Gesell.* 2, 98 (1918).
37. N. F. Mott, *Rev. Mod. Phys.* 40, 677 (1968).
38. A. Mittiga, F. Biccari, e C. Malerba, *Thin Solid Films* 517, 2469 (2009).
39. M. Tapiero, Zielinge. Jp, e C. Noguet, *Phys. Status Solidi A-Appl. Res.* 12, 517 (1972).
40. T. J. Coutts, D. L. Young, e X. N. Li, *MRS Bull.* 25, 58 (2000).
41. Y. Nakano, S. Saeki, e T. Morikawa, *Appl. Phys. Lett.* 94, 022111 (2009).

The invention claimed is:

1. p-Type amorphous semiconductor material, characterized in that it comprises alloys based on the following:
   a. copper monoxide with Cu metal species embedded in its structure $[(OCu_2)_x+(Cu_{1-2})_y$, wherein $0.05 \leq x < 1$ and $0.01 \leq y \leq 0.9]$; or
   b. copper and tin alloy monoxide containing Cu and Sn metal species in its structure, in single form or as an alloy $[(O-Cu-Sn)_a+(Cu_\alpha-Sn_\beta)_b$ with $0<\alpha<2$ and $0<\beta<2$, wherein $0.05 \leq a < 1$ and $0.01 \leq b \leq 0.9]$; or
   c. nickel monoxide containing Ni and Sn metal species in its structure, in single form or as an alloy $[(O-Ni)_a+(Ni_\alpha-Sn_\beta)_b$ with $0<\alpha<2$ and $0<\beta<2$, wherein $0.05 \leq a < 1$ and $0.01 \leq b \leq 0.9]$;
   or combinations thereof.

2. The material according to claim 1, characterized in that the percentage of metal species varies between 0.5% and 15%.

3. The material according to claim 1, characterized in that it is obtainable by depositing at a temperature below 250° C., notwithstanding a tolerance of 50° C., or obtainable by depositing and subsequently annealing at a temperature below 300° C., preferably at 250° C., notwithstanding a tolerance of 50° C.

4. An insulating film comprising the material according to claim 1, characterized in that said material additionally comprises oxygen incorporated in its structure, with an Opp, oxygen partial pressure, larger than 9%.

5. A conductive film comprising the material according to claim 1, characterized in that said material comprises amounts of oxygen and incorporated metal species in order to obtain a conductive film.

6. The material according to claim 1, characterized in that it further comprises impurities or additives for controlling the electronic properties, whose properties comprise the number of free carriers as positive charges, whose impurities particularly comprise zirconium or nitrogen, up to 20% of the total composition.

7. The material according to claim 1,
   characterized in that it is used as p-type semiconductor in order to obtain a metal-insulator-semiconductor, MIS, type diode, wherein the diode comprises a metal such as Nickel in one side of said diode, and has as an insulator the same material with incorporated oxygen concentrations larger than 45%, or another organic or inorganic material, such as mylar or hafnia;
   characterized in that it is simultaneously used as ohmic contact and as active element of the junction in a semiconductor heterojunction;
   characterized in that it is used as an heterojunction, wherein the n-type and p-type layers possess thicknesses in which the thicker oxide corresponds to the semiconductor with lower number of free carriers, and the thinner oxide possesses a thickness at least ten times lower than the previous one and possesses free carriers at least ten up to a hundred times higher than the thicker oxide;
   characterized in that it is used as channel active layer in an individualized or multi-layered or integrated p-type field effect transistor;
   characterized in that it is used as p-type semiconductor in a CMOS or C-MESFET device; or
   characterized in that it is used in the device as n-type semiconductor in which said inorganic covalent semiconductor may be formed with the n-doped silicon, or ionic inorganic semiconductors, such as GTZO or AZTO, or organic semiconductors, or any of the possible hybrid combinations thereof.

8. The material according to claim 1, characterized in that it is in a semiconductor device which further comprises a matching layer with silicon dioxide, or silicon nitride, or tantalum pentoxide, or polymer films, such as SU8, or combinations thereof, with thicknesses between 0.5 nm and 1000 nm.

9. The material according to claim 8, characterized in that the semiconductor device further comprises a surface encapsulation and/or passivation layer, by means of a polymer, such as SU8, or magnesium fluoride, or silicon oxide, or silicon nitride, or combinations thereof.

10. The material according to claim 8, characterized in that the semiconductor device further comprises a rigid substrate, such as ceramics or glass, or a flexible substrate, such as mylar, polymer, or paper.

11. The material according to claim 8, characterized in that the semiconductor device further comprises a natural, synthetic, or mixed cellulose dielectric, referred to as cellulosic or bioorganic or paper material.

12. The material according to claim 8, characterized in that the semiconductor device comprises thin films of cellulosic materials comprised by natural, synthetic, or mixed cellulose operable in order to provide the physical support for the device and to act as dielectric (3) of said device, thereby rendering the device self-sustained.

13. The material according to claim 8, characterized in that the semiconductor device comprises one or more of the elements referred to in the previous claims in gates or logical devices, oscillators, records, controllers, inverters, actuators or drivers, flash memories, solar cells, diodes, light emitting diodes, radio identification devices RFID, or active matrices for displays.

14. The material according to claim 1, characterized in that it allows the use thereof in the manufacture of gates or logical devices, oscillators, records, controllers, inverters, actuators or drivers, flash memories, solar cells, diodes, light emitting diodes, radio identification devices RFID, or active matrices for displays.

15. Process for the manufacture of material, characterized in that it comprises the step of incorporating the p-type material referred to in claim 1.

16. The process for the manufacture of material according to claim 15, characterized in that it comprises the deposition step of the material up to 250° C.

17. The process for the manufacture of material according to claim 15, characterized in that it comprises the annealing step of the material up to 300° C.

* * * * *